US007875867B2

(12) United States Patent
Hershkowitz et al.

(10) Patent No.: US 7,875,867 B2
(45) Date of Patent: *Jan. 25, 2011

(54) NON-AMBIPOLAR RADIO-FREQUENCY PLASMA ELECTRON SOURCE AND SYSTEMS AND METHODS FOR GENERATING ELECTRON BEAMS

(75) Inventors: Noah Hershkowitz, Madison, WI (US); Benjamin Longmier, Madison, WI (US); Scott Baalrud, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 243 days.

This patent is subject to a terminal disclaimer.

(21) Appl. No.: 12/327,639

(22) Filed: Dec. 3, 2008

(65) Prior Publication Data

US 2009/0140176 A1 Jun. 4, 2009

Related U.S. Application Data

(63) Continuation of application No. 11/427,273, filed on Jun. 28, 2006, now Pat. No. 7,498,592.

(51) Int. Cl.
*H01J 27/02* (2006.01)
*H05H 1/24* (2006.01)

(52) U.S. Cl. ............... 250/492.3; 250/382; 250/385.1; 250/387; 315/111.31; 315/111.21; 313/231.31; 313/363

(58) Field of Classification Search ......... 250/281–283, 250/374, 382, 385.1, 387, 423 R, 424, 492.3; 315/111.01, 111.21, 111.31, 111.71, 111.81, 315/111.91; 313/306, 307, 230, 231.61, 313/231.31, 363.1

See application file for complete search history.

(56) References Cited

U.S. PATENT DOCUMENTS

| 2,826,708 | A |   | 3/1958  | Foster, Jr. |            |
|-----------|---|---|---------|-------------|------------|
| 4,517,495 | A |   | 5/1985  | Piepmeier   |            |
| 4,549,082 | A |   | 10/1985 | McMillan    |            |
| 4,910,436 | A | * | 3/1990  | Collins et al. | .......... 315/111.81 |
| 4,977,352 | A |   | 12/1990 | Williamson  |            |

(Continued)

OTHER PUBLICATIONS

Veeco, Product Specification: RFN-300 (RF Neutralizer) External Specification—Manual #425430 Rev. A.

(Continued)

*Primary Examiner*—Bernard E Souw
(74) *Attorney, Agent, or Firm*—Bell & Manning, LLC

(57) ABSTRACT

An electron generating device extracts electrons, through an electron sheath, from plasma produced using RF fields. The electron sheath is located near a grounded ring at one end of a negatively biased conducting surface, which is normally a cylinder. Extracted electrons pass through the grounded ring in the presence of a steady state axial magnetic field. Sufficiently large magnetic fields and/or RF power into the plasma allow for helicon plasma generation. The ion loss area is sufficiently large compared to the electron loss area to allow for total non-ambipolar extraction of all electrons leaving the plasma. Voids in the negatively-biased conducting surface allow the time-varying magnetic fields provided by the antenna to inductively couple to the plasma within the conducting surface. The conducting surface acts as a Faraday shield, which reduces any time-varying electric fields from entering the conductive surface, i.e. blocks capacitive coupling between the antenna and the plasma.

17 Claims, 15 Drawing Sheets

U.S. PATENT DOCUMENTS

| | | | |
|---|---|---|---|
| 5,081,398 | A | 1/1992 | Asmussen et al. |
| 5,107,170 | A | 4/1992 | Ishikawa et al. |
| 5,198,718 | A | 3/1993 | Davis et al. |
| 5,241,244 | A | 8/1993 | Cirri |
| 5,468,955 | A | 11/1995 | Chen et al. |
| 5,663,971 | A | 9/1997 | Carlsten |
| 5,874,807 | A | 2/1999 | Neger et al. |
| 6,014,387 | A | 1/2000 | Carlsten |
| 6,060,718 | A | 5/2000 | Brailove et al. |
| 6,100,536 | A | 8/2000 | Ito et al. |
| 6,150,755 | A | 11/2000 | Druz et al. |
| 6,184,623 | B1 | 2/2001 | Sugai et al. |
| 6,211,622 | B1 * | 4/2001 | Ryoji et al. ............ 315/111.21 |
| 6,417,111 | B2 | 7/2002 | Nishikawa et al. |
| 6,512,333 | B2 | 1/2003 | Chen |
| 6,661,165 | B2 | 12/2003 | Closs et al. |
| 6,768,120 | B2 | 7/2004 | Leung et al. |
| 6,805,779 | B2 | 10/2004 | Chistyakov |
| 6,809,310 | B2 | 10/2004 | Chen |
| 6,849,857 | B2 | 2/2005 | Ichiki et al. |
| 6,870,321 | B2 | 3/2005 | Schartner et al. |
| 6,967,334 | B2 | 11/2005 | Suzuki et al. |
| 7,012,263 | B2 | 3/2006 | Murata et al. |
| 7,064,491 | B2 | 6/2006 | Horsky et al. |
| 7,078,862 | B2 * | 7/2006 | Fukuda et al. ......... 315/111.21 |
| 7,087,912 | B2 | 8/2006 | Hamamoto |
| 7,326,937 | B2 | 2/2008 | Mehta et al. |
| 7,498,592 | B2 * | 3/2009 | Hershkowitz et al. .... 250/492.3 |
| 2001/0015173 | A1 | 8/2001 | Matsumoto et al. |
| 2003/0209430 | A1 | 11/2003 | Hamamoto |
| 2004/0036032 | A1 | 2/2004 | Leung et al. |
| 2004/0221815 | A1 * | 11/2004 | Fukuda et al. ............ 118/723 I |
| 2005/0194361 | A1 | 9/2005 | Yeom et al. |
| 2007/0018562 | A1 | 1/2007 | Adamec et al. |
| 2008/0067430 | A1 * | 3/2008 | Hershkowitz et al. .... 250/492.3 |
| 2010/0032587 | A1 * | 2/2010 | Hosch et al. ............. 250/492.3 |

OTHER PUBLICATIONS

Veeco Product RFN-300 Product Manual (excerpts) 2005.

"Helicons—The Early Years," Rod W. Boswell and Francis F. Chen, IEEE Transactions on Plasma Science, vol. 25, No. 6, pp. 1229-1244, Dec. 1997.

"Helicons—The Past Decade," Francis F. Chen and Rod W. Boswell, IEEE Transactions on Plasma Science, vol. 25, No. 6, pp. 1244-1257, Dec. 1997.

"Sheaths: More complicated than you think," Noah Hershkowitz, Physics of Plasma 12, 052502, pp. 1-11 (2005), American Institute of Physics.

"Steady-state ion pumping of a potential dip near an electron collecting anode," Cary Forest and Noah Hershkowitz, J. Appl. Phys. 60(4), pp. 1295-1299, Aug. 15, 1986, American Institute of Physics.

"Neutral pumping in a helicon discharge," J. Gilland, R. Breun, and N. Hershkowitz, Plasma Sources Sci. Technol. 7, pp. 416-422, (1998).

*High Density Plasma Sources, Design, Physics and Performance*, Preface and Chapters 1-3 and 7, Oleg A. Popov (Ed.) (1995).

"Non-Ambipolar Electron Extraction from a Weakly Magnetized RF Plasma," Noah Hershkowitz and Ben W. Longmier, Powerpoint presentation, IEEE International Conference on Plasma Science, University Wisconsin—Madison, Jun. 4-8, 2006.

"'Electrodeless' Plasma Cathode for Neutralization of Ion Thrusters," Ben Longmier and Noah Hershkowitz, Powerpoint Presentation, 41st AIAA/ASME/SAE/ASEE Joint Propulsion Conference & Exhibit, Tuscon, AZ, Jul. 10-13, 2005.

"'Electrodeless' Plasma Cathode for Neutralization of Ion Thrusters," Ben Longmier and Noah Hershkowitz, 41st AIAA/ASME/SAE/ASEE Joint Propulsion Conference & Exhibit, pp. 1-7, Tuscon, AZ, Jul. 10-13, 2005.

"Nonambipolar Electron Source for Neutralization of Ion and Hall Thrusters," Ben W. Longmier and Noah Hershkowitz, 29th International Electric Propulsion Conference, pp. 1-9, Princeton University, Oct. 31-Nov. 4, 2005.

"Nonambipolar Electron Source for Neutralization of Ion and Hall Thrusters," Ben W. Longmier and Noah Hershkowitz, Poster presented at the 29th International Electric Propulsion Conference, Princeton University, Oct. 31-Nov. 4, 2005.

* cited by examiner

NON-AMBIPOLAR RADIO-FREQUENCY PLASMA ELECTRON SOURCE AND SYSTEMS AND METHODS FOR GENERATING ELECTRON BEAMS

CROSS REFERENCE TO RELATED APPLICATIONS

This application is a continuation of U.S. patent application Ser. No. 11/427,273, now U.S. Pat. No. 7,498,592 filed Jun. 28, 2006, the disclosure of which is incorporated herein by reference in its entirety.

This invention was made with United States government support awarded by the following agencies:

DOE DE-FG02-97ER5

NASA NNC04GA82G and T302-9700

The United States government has certain rights in this invention.

BACKGROUND OF THE INVENTION

1. Field of the Invention

This invention is directed to systems, methods and devices for generating an electron beam.

2. Related Art

Electron beam sources are widely used in a variety of applications. Electron beam generators are used both as sources for the electron beams themselves, as charge neutralizers for charged ion beams, to produce protective thermal spacecraft coatings, to form plasma-assisted thin films, and to deposit optical coatings, such as, for example, for large mirrors, in forming metallized packaging films and in electron beam evaporation, electron beam surface modification, thin film growth, plasma-assisted chemical vapor deposition, plasma vapor deposition, electron beam curing, waste handling, and electron beam reactive deposition.

Ion beams are used both in the semiconductor manufacturing industry and many other industries, as well as in many satellites and other spacecraft, and other applications. In such satellites and other spacecraft, ion beams are used as thrusters to maneuver the satellites or other spacecraft. In the semiconductor industry, ion beams are used for a variety of purposes, including etching, ion implantation, doping, sputtering, and the like.

In both semiconductor manufacturing and spacecraft/satellite maneuvering embodiments, it is highly desirable, if not absolutely necessary, that the plasma stream, i.e., the ion beam, be electrically neutral. The ion beams are typically generated by stripping electrons off of atoms of the desired material to create positively-charged ions. These positively-charged ions are accelerated by an electric field and formed into a beam. Typically, the positively-charged ions originate in a plasma.

However, due to space-charge limitations within the ion beams, the charged ions in the ion beams tend not to stay tightly packed in the beam. Rather, the ion beam tends to "blow apart" due to the repulsive force between the similarly-charged ions. Furthermore, positively-charged ion beams are attracted to negatively-charged surfaces. For example, in the spacecraft/satellite embodiments, if the beam remains positively-charged, two problems arise. First, the spacecraft/satellite itself becomes negatively charged when the positive charge is emitted. Second, because the ion beam is positively charged, it becomes attracted to the negatively-charged spacecraft/satellite, and thus does not travel in a straight line away from the spacecraft or satellite, or, in a worst-case leave the spacecraft environment at all. Rather, the positively-charged ions move within the electric field formed by the negatively-charged spacecraft/satellite and return toward the spacecraft/satellite due to the electrostatic attraction between the negatively-charged spacecraft/satellite and the positively-charged ions. As a result, a positively-charged ion beam does not provide the proper thrust to appropriately maneuver the satellite or spacecraft.

Typically, to avoid these problems, the positively-charged ion beam is neutralized shortly after it leaves the ion beam generating device by combining the positively-charged ion beam with a beam of (negatively-charged) electrons. The combination of the electrons and positively-charged ions renders the net plasma stream neutrally charged. However, because of the relatively light weight of the electrons, relative to the ions, the electrons do not significantly affect the thrust provided by the ion beam. Moreover, by extracting equal currents of ions and electrons, no net charge accumulates in and/or on the spacecraft/satellite. Because the ions in the plasma stream are now balanced by electrons, a net electric field does not arise on the spacecraft or satellite. Thus, the plasma stream moves in a straight line away from the satellite or spacecraft, providing the desired thrust.

SUMMARY OF THE DISCLOSED EMBODIMENTS

Conventionally, electron beams associated with spacecraft are generated by hollow cathodes. However, hollow cathodes are problematic for a number of reasons. First, as the hollow cathodes are used to generate the desired electron beam, they are slowly consumed. Typical maximum lifetimes for commercial hollow electrodes are on the order of only three to four years. Additionally, the present generation of hollow cathodes employ barium oxide-tungsten (BaO—W) inserts as their emitting surface. However, this emitting surface deteriorates over time. Once the hollow cathode becomes inoperable, it is no longer possible to use the electron generating device. Additionally, hollow cathodes are difficult to ignite, either initially or if they should go out during use, and can become contaminated, thus reducing their efficiency.

One proposed solution for this limited lifetime is to provide multiple hollow-cathode electron generating devices and/or to provide multiple hollow cathodes within a single hollow-cathode electron generating device. However, these solutions are problematic for a number of reasons. First, for weight-limited devices such as satellites and spacecraft, providing two electron generating devices consumes valuable and limited weight and space within the spacecraft/satellite. Second, even when two such hollow-cathode electron generating devices are provided, it has not always been easy to ignite the hollow cathode in the second hollow-cathode electron generating device. This is also true when multiple hollow cathodes are provided in the same hollow-cathode electron generating device.

While hollow cathode-electron generating devices have limited useful lifespans and the other problems outlined above, they are generally well-understood devices that reliably provide electron beams over their lifetimes. Any competing technology should be at least as useful, reliable, and efficient or long-lived as hollow cathode devices to be commercially successful.

This invention provides an electrode-less electron beam generating device.

This invention separately provides systems and methods for providing non-ambipolar electron flow in an electron generating device.

This invention separately provides systems and methods for providing total non-ambipolar electron flow in an electron generating device.

This invention separately provides systems and methods for creating an electron-generating plasma using magnetic induction to generate currents in the plasma.

This invention separately provides systems and methods for creating an electron-generating plasma using helicon-wave induction fields to generate currents in the plasma.

This invention separately provides systems and methods for improving electron extraction in an electron beam generating device.

This invention separately provides systems and methods for gridless non-ambipolar electron extraction of electrons from an electron beam generating device.

This invention separately provides systems and methods for extracting electrons from an electron beam generating device through an electron sheath.

In various exemplary embodiments of systems, methods and/or devices according to this invention, an electron beam generating device produces electron beams from a plasma, where the plasma is produced using radio-frequency (RF) fields and electron extraction occurs through electron sheaths. In various exemplary embodiments, an ion loss area is selected based on an electron extraction area, the ion mass and the electron mass. In various exemplary embodiments, the ion loss area is sufficiently large to allow for total non-ambipolar electron extraction. In various exemplary embodiments, the ions are lost to a negatively-biased conducting surface. In various exemplary embodiments, the negatively-biased conducting surface is a cylinder. In various exemplary embodiments, electrons are extracted through a grounded ring that is mounted in or behind an insulating boundary provided at one end of the conducting cylinder. In various exemplary embodiments, the electrons extracted from the plasma pass to or through the grounded ring, while the ions are lost to the negatively-biased conducting surface. In various exemplary embodiments, an axial magnetic field that is parallel to the axis of the ring is used to enhance electron extraction through the ring. In various exemplary embodiments, the axial magnetic field also reduces the electron current to the ring itself.

In various exemplary embodiments, an antenna located outside of the negatively-biased conducting surface generates a varying RF electromagnetic field around the electron beam generating device. The antenna can be capacitively coupled to the plasma, inductively driving currents in the plasma or inductively exciting helicon waves, provided in the negatively-biased conducting cylinder depending on the structure of the device and the plasma density. In various exemplary embodiments, slots or other voids in a negatively-biased conducting cylinder to allow the time-varying magnetic fields provided by the antenna to extend into the interior of the negatively-biased conducting cylinder to inductively couple to the gas within the negatively-biased conducting cylinder. In various exemplary embodiments, the negatively-biased conducting cylinder acts as Faraday shield to reduce, and possibly eliminate, any capacitive coupling of electric fields between the antenna and the plasma. In various exemplary embodiments, a simple antenna is used In various other exemplary embodiments, the antenna is configured to allow inductive or helicon coupling to the plasma.

In various exemplary embodiments, a non-conducting closed surface is placed around the negatively-biased conducting cylinder to confine the plasma and a source gas. In various exemplary embodiments, electron extraction aperture dimensions of the grounded electron extraction ring and the gas flow rate into the chamber determine the appropriate neutral gas pressure within the electron beam generating device. In various exemplary embodiments, any neutral gas can be used.

In various exemplary embodiments, the device can be operated with a variety of non-time-varying (DC) magnetic field configurations. Given sufficient RF power, such steady-state or DC magnetic fields allow helicon waves to be excited within the plasma in the interior of the electron beam generating device. Helicon waves allow the extracted electron current to be increased due to increases in the plasma density. In various exemplary embodiments, the steady-state or DC magnetic fields are aligned axially. In various exemplary embodiments, the steady-state or DC axial magnetic fields are produced by permanent magnets and/or by electromagnets.

These and other features and advantages of various exemplary embodiments of systems and methods according to this invention are described in, or are apparent from, the following detailed descriptions of various exemplary embodiments of various devices, structures and/or methods according to this invention.

BRIEF DESCRIPTION OF DRAWINGS

Various exemplary embodiments of the systems and methods according to this invention will be described in detail, with reference to the following figures, wherein.

DETAILED DESCRIPTION OF EXEMPLARY EMBODIMENTS

Figure 1:
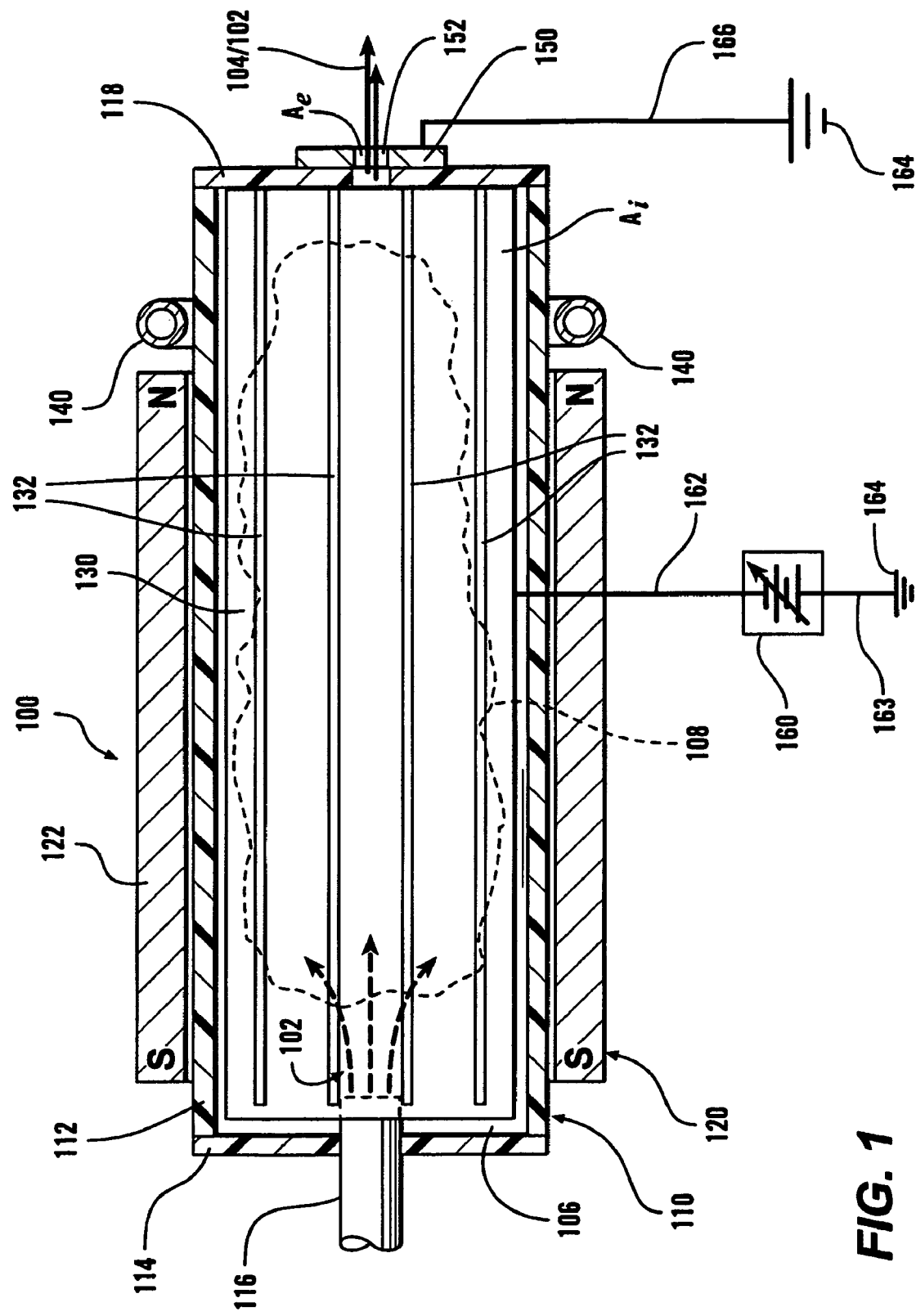
FIG. 1 is a side-cross sectional view of a first exemplary embodiment of an electron beam generating device according to this invention.

Ion and Hall thrusters use beams of positively-charged ions for propulsion. As discussed above, electrons or negative ions should be introduced into the positively-charged ion beam as it leaves the thruster. This is done to prevent the spacecraft from becoming negatively charged and thus attracting the emitted positively-charged ion beam.

Traditionally, hollow cathodes have been used as neutralizing sources because of their high electron current density and relatively low power requirements. However, the operational lifetime of such hollow cathodes is limited by cathode deterioration, cathode contamination, and other effects. This limited operational lifetime for hollow cathodes renders hollow cathodes less suitable for sustained use or where maintaining such hollow cathodes is difficult or impossible.

Longer duration spacecraft missions that use ion propulsion, such as the proposed Jupiter Icy Moons Mission (JIMO), will take 6-10 years for the total orbital transfer time. While using ion propulsion for such longer duration missions is very beneficial relative to impulsive chemical rocket burns, due to the savings in fuel mass and time, the lifetime for some operating components for ion propulsion, such as the hollow cathodes, may be limited to no more than 3 to 4 years. The hollow cathode neutralizer and plasma sources that were used for the highly successful Deep space 1 and SMART-1 missions were limited to no more than 3 to 4 years of operational lifetime due to significant erosion, sputtering and re-deposition of material within the keeper region and surrounding area of such devices.

The inventors have determined that radio-frequency (RF) plasmas are attractive as sources for neutralizing charge carriers for electric propulsion devices, such as Hall and ion thrusters. Such radio-frequency plasmas allow for an electrode-less design and provide high efficiency and long operational lifetimes. Radio-frequency plasma sources provide an alternative neutralizing approach that does not consume electrode material, while providing electrons, allowing for a longer operational lifetime.

There are a variety of radio-frequency plasma sources, including capacitive and inductive sources, that operate without magnetic fields, and electron cyclotron resonance (ECR) sources and helicon sources that require axial magnetic fields. Helicon sources can produce the highest plasma densities, which can be greater than $10^{13}/cm^3$, for a given radio-frequency power. However, helicon sources also require magnetic fields. Lower RF power emitted by the excitation antenna into the plasma requires higher magnetic field strengths. For example, a 10 W radio-frequency signal typically requires a 2000 Gauss magnetic field. In contrast, lower magnetic field strengths require higher RF power into the plasma. For example, a 300 Gauss magnetic field typically requires the excitation antenna to emit 600 W. If sufficient power is not available, helicon sources will operate as inductive sources. Inductively coupled plasmas can achieve significant plasma densities, such as, for example, $10^{10}/cm^3$ to $10^{12}/cm^3$ and allow for a large total electron extraction current.

Figure 2:
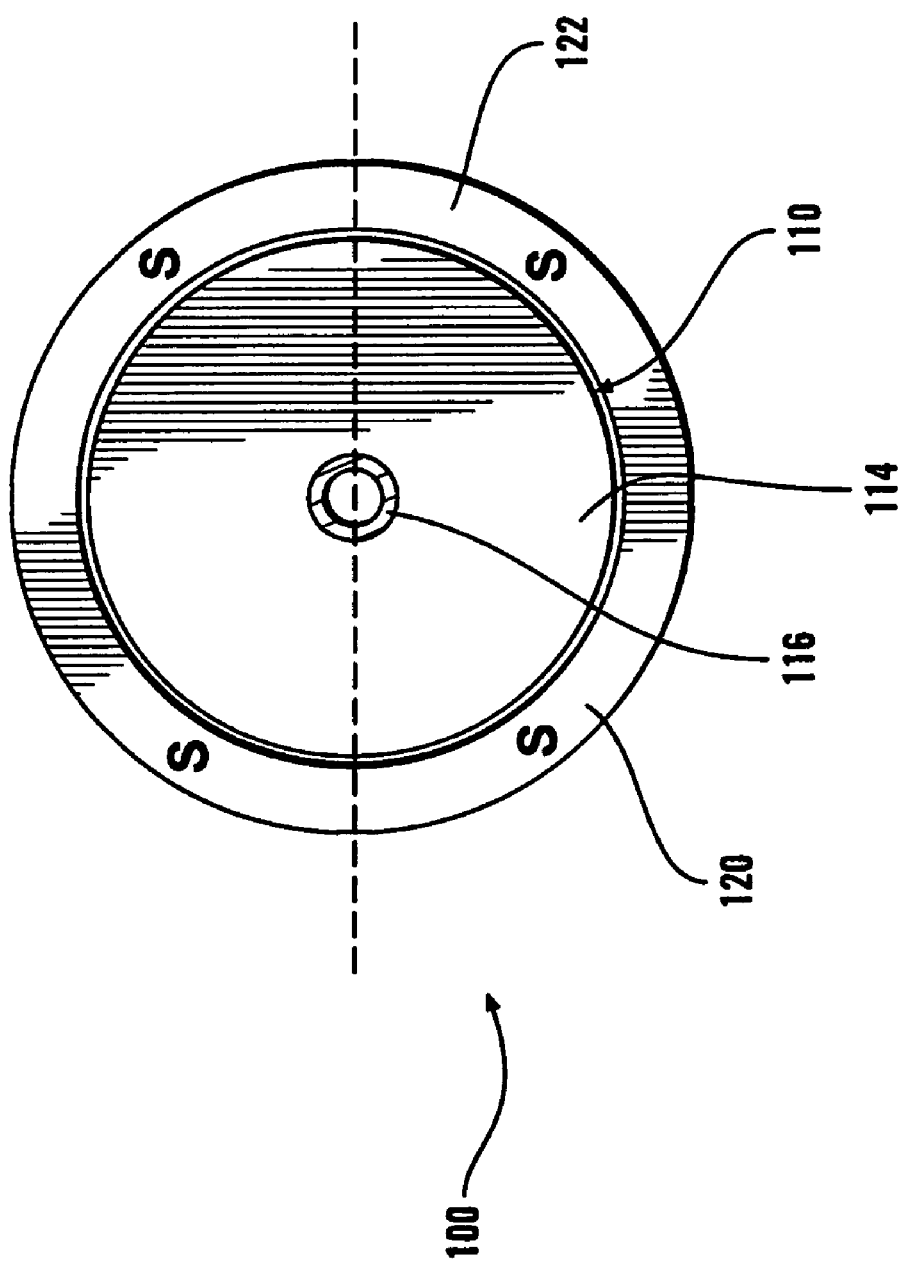
FIG. 2 is a plan end view of a first end of the first exemplary embodiment of the electron beam generating device shown in FIG. 1.
Figure 3:
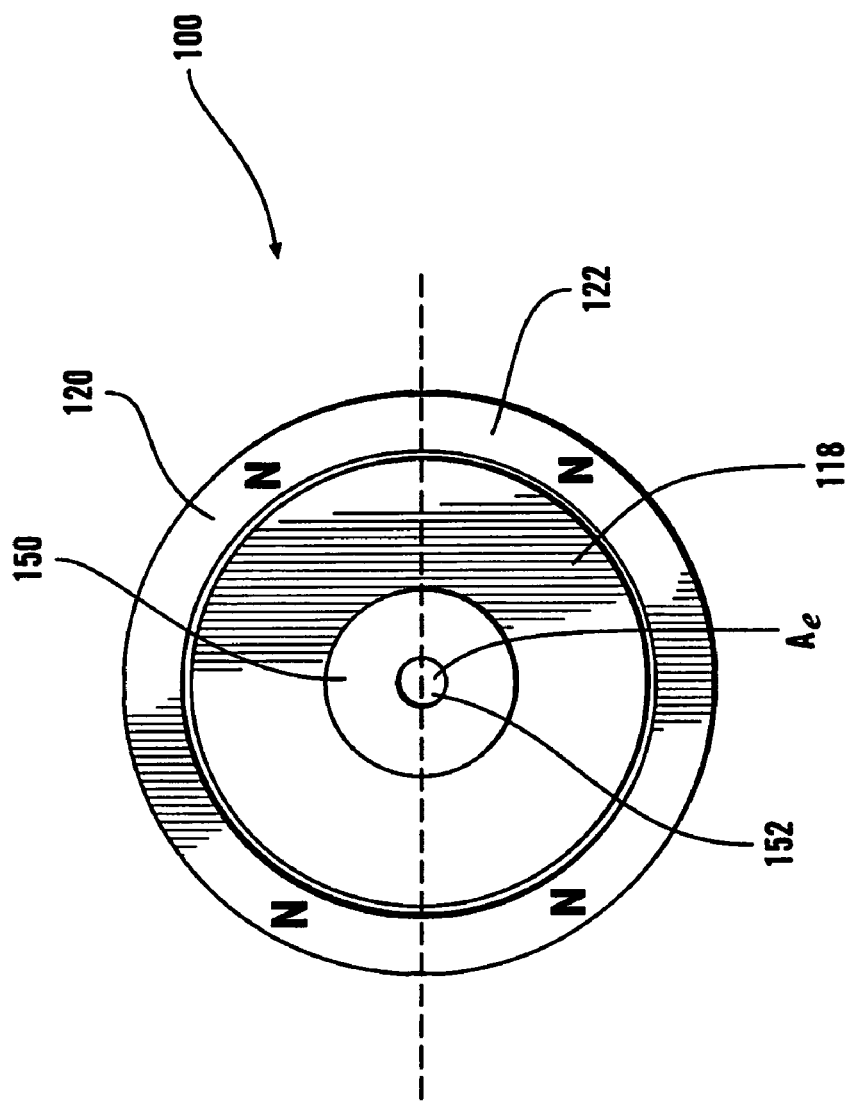
FIG. 3 is a plan view of the other end of the first exemplary embodiment of the electron beam generating device shown in FIG. 1.
Figure 4:
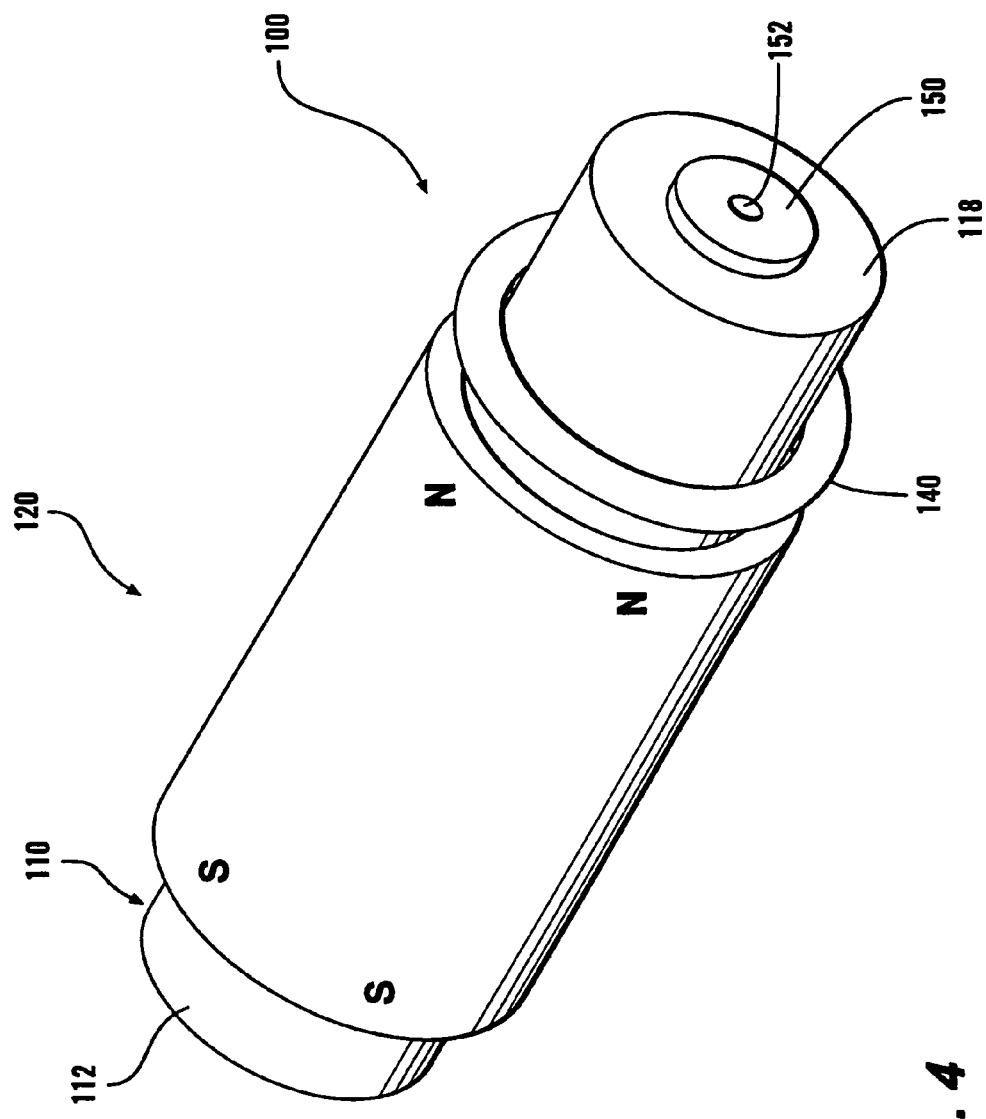
FIG. 4 is side perspective view of the first exemplary embodiment of the electron beam generating device shown in FIG. 1.

FIG. 1 shows a first exemplary embodiment of an electron beam generating device according to this invention that is useable to generate a radio-frequency plasma that provides a beam of electrons without an electrode. As shown in FIG. 1, in various exemplary embodiments, the electron beam generating device 100 comprises a generally non-conductive exterior chamber 110, one or more steady-state magnets 120, a conductive ion-collection surface 130, a radio-frequency antenna 140, an electron extraction ring 150, and connections 162 and 166 to a negative voltage source 160 and a reference ground voltage 164, respectively. FIGS. 2 and 3 show exterior plan views of supply and extraction end walls 114 and 118, respectively, of the non-conductive exterior chamber of the electron beam generating device 100. FIG. 4 shows a side perspective view of the electron beam generating device 100.

As shown in FIG. 1, the non-conductive exterior chamber 110 comprises a non-conductive chamber surface 112, a non-conductive supply end wall 114, and a non-conductive extraction end wall 118. A gas supply tube 116 extends through the supply end wall 114 and into an interior of the conductive ion-collection chamber 130. The gas supply tube 116 supplies a feed gas 102 at least into an interior space 106 that is enclosed by the non-conductive exterior chamber 110. During operation, the electron beam generating device 100 forms a plasma 108 within in the interior space 106 such that an electron beam 104 passes, along with the feed gas 102, through a central aperture, hole or passageway 152 in the electron extraction ring 150. The electron extraction ring 150 is located in, and extends through, the extraction end wall 118 into the interior space 106.

As shown in FIG. 1, in various exemplary embodiments, the one or more steady-state magnets 120, such as the cylindrical steady-state magnet 122, are arranged such that the south (or north) poles of the one or more steady-state magnets 120 face the supply end wall 114, while the north (or south) poles of the one or more steady-state magnets 120 face the extraction end wall 118. It should be appreciated that it is not important that the north end faces the extraction side. However, the one or more steady-state magnets 120 should produce a magnetic field that is aligned with the axis of the center extraction aperture or passageway 152. As shown in FIG. 1, in various exemplary embodiments, the at least one steady-state magnet 120 can be located outside of and surrounding the non-conductive exterior chamber 110.

It should be appreciated that, in various exemplary embodiments, the non-conductive exterior chamber 110 is cylindrical in cross section. Accordingly, in such exemplary embodiments, the at least one steady-state magnet 120 has a corresponding cylindrical central opening through which the non-conductive exterior chamber 110 extends. However, it should be appreciated that, in various other exemplary embodiments, the non-conductive exterior chamber 110 can have any desired cross-sectional shape that defines a simple closed curve, such as a circle, a regular or irregular polygon or the like. Typically, the one or more steady-state magnets 120 will be placed around the non-conductive exterior chamber 110 such that the central passageway formed within the at least one steady-state magnet 120 will closely follow the surface of the non-conductive exterior chamber 110.

The one or more steady-state magnets 120 generate a generally solenoidal magnetic field that extends along the axial direction of the non-conductive exterior chamber 110. In various exemplary embodiments, such as that shown in FIG. 1, the at least one steady-state magnet 120 comprises only a first steady-state magnet 122. In various exemplary embodiments, the first steady-state magnet 122 is a permanent magnet. However, in various other exemplary embodiments, the one or more steady-state magnets 120 can be electromagnets provided with a steady-state or DC electric current.

As shown in FIG. 1, the conductive ion-collection surface 130 is provided adjacent to at least the extraction end wall 118 within the interior space 106 provided in the non-conductive exterior chamber 110. Likewise, as shown in FIG. 1, in various exemplary embodiments, the conductive ion-collection surface 130 closely follows the interior surface of the non-conductive exterior chamber 110. The radio-frequency antenna 140 is placed around the exterior of the non-conductive exterior chamber 110. The location for the radio-frequency antenna 140 allows the radio-frequency electric and/or magnetic fields generated by placing a radio-frequency signal onto the radio-frequency antenna 140 to interact with the feed gas 102 to create the plasma 108. In various exemplary embodiments, the radio-frequency antenna 140 is formed from a single turn of water-cooled copper pipe and can operate at radio frequencies normally less than the electron cyclotron frequency, where the electron cyclotron frequency $f_c$ is:

$$f_c = \frac{eB}{2\pi m_e},$$

where:
  e is the electron charge;
  B is the magnetic field strength; and
  $m_e$ is the electron mass.

As shown in FIG. 1, in various exemplary embodiments, the conductive ion-collection surface 130 has a plurality of slots or voids 132 formed in it. In various exemplary embodiments, these slots or voids 132 extend from the end of the conductive ion-collection surface 130 that is adjacent to the extraction end wall 118 inwardly toward the other end of the conductive ion-collection surface 130. In various exemplary embodiments, the slots or voids 132 extend through, and 80%-90% of the way along the axial length of, the conductive ion-collection surface 130. It should be appreciated that, due to the slots or voids 132, the conductive ion-collection surface 130 forms a Faraday shield. The conductive ion-collection surface thus reduces, and ideally eliminates, the time-varying electric field, generated by placing the radio-frequency signal on the radio-frequency antenna 140, from penetrating into the plasma chamber portion 131 of the interior space 106 that is enclosed or surrounded by the conductive ion-collection surface 130. At the same time, the slots or voids 132 in the conductive ion-collection surface 130 allow the time-varying magnetic fields to penetrate into the plasma chamber portion 131 of the interior space 106.

However, it should be appreciated that, in some exemplary embodiments, it may be desirable to allow some capacitive coupling to occur between the antenna 140 and the plasma 108. Such capacitive coupling can be used to ignite the plasma. It should further be appreciated that any other known or later developed ignition device or structure that is usable to ignite the plasma 108 can be used. In such exemplary embodiments, capacitive coupling between the antenna 140 and the plasma 108 can be substantially eliminated, and, potentially, completely eliminated.

As shown in FIG. 1, the conductive ion-collection surface 130 is connected by a connection 162 to a relatively negative voltage source 160. It should be appreciated that, in this context, the voltage on the conductive ion collection surface 130 need only be relatively negative, i.e., less than, compared to the voltage applied to the extraction ring 150. Here, the difference in potential between the plasma and the ion collection cylinder should be much greater than the electron temperature, in eV, divided by the electron charge. Consequently, the conductive ion-collection surface 130 is at a negative potential with respect to the extraction ring 150 and the plasma 108, and thus acts to attract the positively-charged ions that are present within the plasma 108.

As shown in FIG. 1, the conductive ion-collection surface 130 has a surface area, or ion loss area, $A_i$. It should be appreciated that the ion loss area $A_i$ depends upon the axial length of the conductive ion-collection surface 130, its shape and surface conformation, and the area consumed by the slots or voids 132. In particular, the ion loss obtained by the conductive ion collection surface 130 is a function of an effective ion loss area $A_i$ that differs from the geometric $A_g$ and is determined by the magnetic field B. It should be appreciated that, in various exemplary embodiments, it is generally desirable to maximize the surface or ion loss area $A_i$ of the conductive ion-collection surface 130. Maximizing the ion loss area $A_i$ is desirable as it provides the maximum electron extraction that is allowed by the electron loss area $A_e$. It is generally desirable to increase the ion collection area $A_i$ because that determines the maximum electron current that can be lost to the electron sheath. This occurs when the relationship $A_e/A_i \geq \sqrt{m_e/m_i}$ is satisfied, i.e., total non-ambipolar flow is obtained. In various exemplary embodiments, the cross-sectional shape of the conductive ion-collection surface 130 closely follows the cross-section of the non-conductive exterior chamber 110. In various exemplary embodiments, the non-conductive exterior chamber 110 and the conductive ion-collection surface 130 are concentric cylinders.

The central aperture, hole or passageway 152 in the electron extraction ring 150 allows the feed gas 102 and the electrons obtained from the plasma 108 to be emitted from the electron beam generating device 100 as the electron beam 104. As shown in FIG. 1, the electron extraction ring 150 is connected by a connection 166 to a local ground potential 164.

Figure 5:
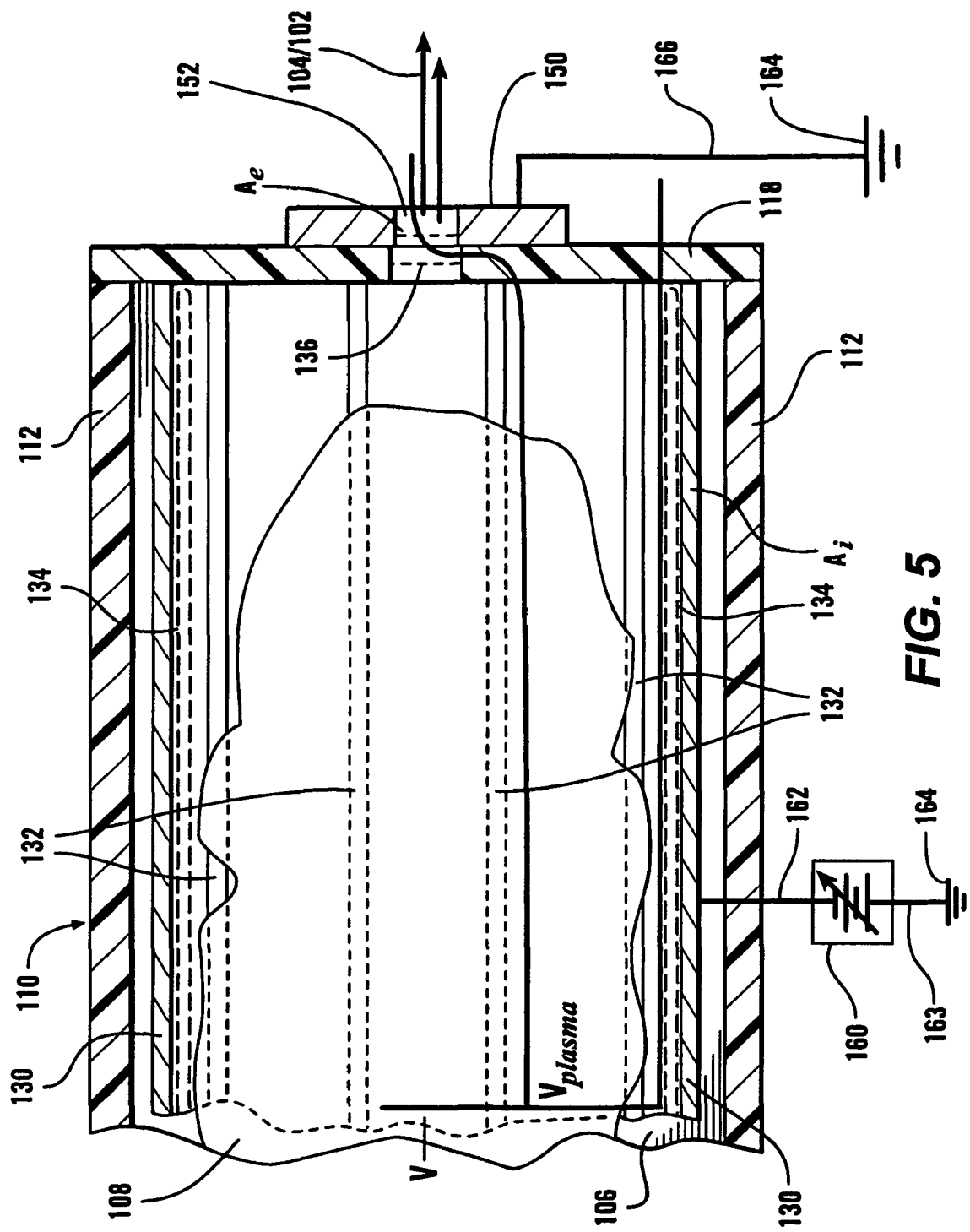
FIG. 5 is a side-cross sectional view showing in greater detail a first exemplary embodiment of the extraction end of the first exemplary embodiment of the electron beam generating device shown in FIG. 1.
Figure 6:
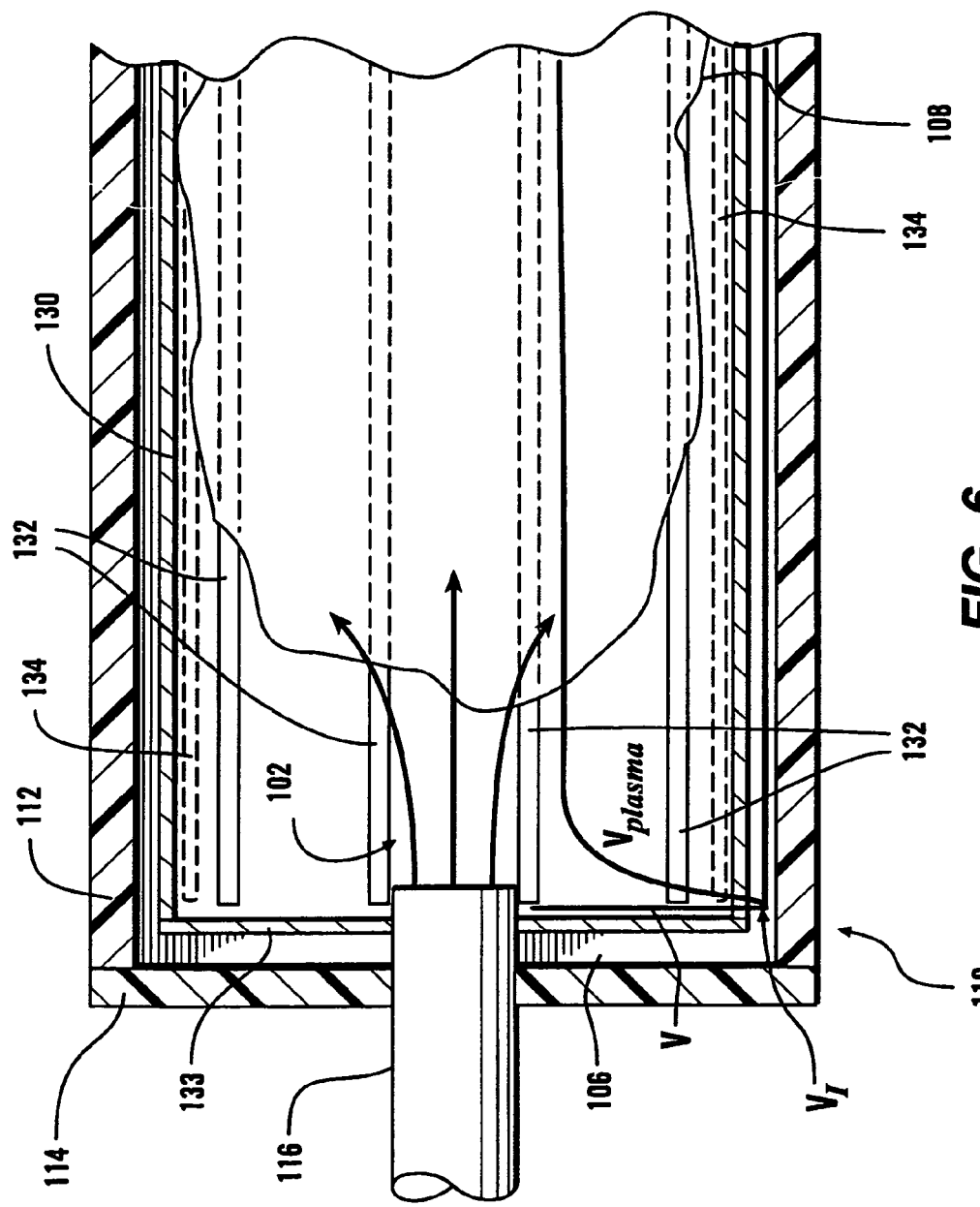
FIG. 6 is a side cross-sectional view showing in greater detail one exemplary embodiment of the supply end of the first exemplary embodiment of the electron beam generating device shown in FIG. 1.

The conductive ion-collection surface 130 acts as a radial boundary for the plasma 108 and acts as the location for the formation of an ion sheath, shown in FIGS. 5 and 6, that prevents electrons from leaking to the walls of the conductive ion-collection surface 130 and/or the non-conductive exterior chamber 110. In various exemplary embodiments, the cylindrical conductive ion-collection surface 130 has between 1 and 8 or more axial slots or voids 132. It should be appreciated that, while there could be a larger number of slots, this would tend to decrease the ion loss area $A_i$ and increase the penetration of the time-varying electric fields. The axial slots or voids 132 allow the time-varying magnetic fields, generated by placing a radio-frequency signal onto the radio-frequency antenna 140, into the plasma chamber portion 131 of the interior space 106 that is enclosed by the cylindrical conductive ion-collection surface 130. At the same time, the conductive ion-collection surface 130 limits the time-varying electric fields generated by placing the radio-frequency signal onto the radio-frequency antenna 140 from entering into the plasma chamber.

The electron extraction ring 150 creates an axial boundary condition, limiting the ability of the ions and the feed gas 102 to exit the interior space 106 through the central aperture, hole or passageway 152. In various exemplary embodiments, the electron extraction ring 150 creates a potential reference for the plasma 108 somewhere near the potential of the plasma 108. An electron loss area $A_e$ is established within the aperture 152 of the electron extraction ring 150. The electron loss area $A_e$ can be as large as the area of the aperture 152. However, an electron sheath usually forms near the extraction ring 150. As indicated above, the electron extraction ring 150 can extend through the extraction end wall 118. In various exemplary embodiments, the electron extraction ring 150 extends into the interior space 106 from the extraction end wall 118 within the conductive ion-collection surface 130.

The plasma 108 is formed by supplying the feed gas 102 from a mass flow controller (not shown) to at least the interior space 106 through the gas supply tube 116. In various exemplary embodiments, the feed gas 102 is argon (Ar), xenon (Xe), or other noble gas. However, it should be appreciated that, in various other exemplary embodiments, the feed gas 102 can be any desired elemental gas, gas mixture or the like. In various exemplary embodiments, the feed gas 102 flows from the gas supply tube 116 into a source, or plasma, region of the interior space 106 where the feed gas 102 is excited by the radio-frequency antenna 140 to form the plasma 108. In the exemplary embodiment shown in FIG. 1, this source region is the plasma chamber portion 131. It should be appreciated that the feed gas 102 can be supplied into the interior space 106 using the gas supply tube 116 or any other known or later-developed device, structure or system that is capable of supplying the feed gas 102 into the interior space 106.

FIGS. 2-4 show plan end views and a perspective view, respectively of the exemplary embodiment of the electron beam generating device 100 shown in FIG. 1. In particular, FIGS. 2-4 illustrate that, in various exemplary embodiments, the permanent magnet or electromagnet 122 has a cylindrical space that allows the cylindrical non-conductive exterior chamber 110 to extend through the first steady-state magnet 122. This first steady-state magnet 122 produces an expanding magnetic field in the region of the radio-frequency antenna 140 and the electron extraction ring 150. The expanding magnetic field creates a cusp in the magnetic field at the point where the north end of the first steady-state magnet 122 is axially adjacent to the end of the cylindrical conductive ion-collection surface 130. It should be appreciated that the cusp in the magnetic field is not critical. However, the effective ion contact area, $A_i$, created by the magnetic field needs to be large enough to provide the desired electron current, following Eqs. (3)-(6) set forth below. The magnetic field should be relatively uniform near the extraction ring.

This solenoidal magnetic field ensures that the electrons follow the magnetic field lines that pass through the central aperture, hole or passageway 152, i.e., the exit region, of the electron extraction ring 150. It should be appreciated that, for spacecraft/satellites and other space and/or weight limited structures, permanent magnets are relatively more useful than electromagnets for the electron beam generating device 100, as they do not require a power source for continued operation (in contrast to electromagnets) and are relatively light weight compared to the DC power source that would be required by electromagnets. It should be appreciated that electromagnets provide an option where a magnetic cusp does not exist. Electromagnets can better adjust the strength of the magnetic field, which may increase the amount of extractable electron current.

It should be appreciated that, in general, electron or ion sheaths are non-neutral regions that usually form at plasma boundaries to balance losses of electrons and ions born by ionization within the plasma. An electron sheath is a non-neutral region at the boundary of a plasma that only contains electrons for potential steps much greater than $T_e/e$ (the plasma temperature/electron charge ratio), formed in order to conserve particle flux for the plasma as a whole. An electron sheath exhibits a positive potential step with respect to the bulk plasma potential. Normally, electron sheaths can exist near positively-biased Langmuir probes, which extract small electron currents from the plasma. However, electron beam generating devices according to this invention can use an electron sheath to extract a significant electron current from the plasma. Electron sheaths are normally only present 1) near small probes when such small probes are biased more positively than the plasma potential or 2) at electron emitting surfaces in weakly-collisional, low-pressure plasmas. The inventors have determined, experimentally, that an electron sheath can collect all electrons produced by ionization if sufficient ion loss area $A_i$ is provided for the ions, according to Eq. (4), below.

If all of the boundaries are identical, then ambipolar flow of the electrons and ions from the plasma is obtained. Ambipolar flow refers to both the ions and electrons flowing and reaching a physical boundary together. In such ambipolar flows, the ion loss and the electron loss are balanced at each point on the boundary. In contrast, in non-ambipolar flow, the particles flow from the plasma to the plasma-sheath boundary together, but they do not leave the other end of the sheath, i.e., traverse the sheath, with the same current.

In contrast, if several different (i.e., non-identical) boundaries are present, then at least some non-ambipolar flow is created. Such non-ambipolar flow implies that, at least some points along the boundary, the electron and ion flows do not balance. That is, in such non-ambipolar flow, at some points along the boundary, the electron flux is greater than the ion flux. An electron sheath may exist at such points. In contrast, at various other boundary points, the ion flux exceeds the electron flux. An ion sheath exists at such points. It should be appreciated that an ion sheath will also exist for normal ambipolar flow.

With non-ambipolar flow, while the electron and ion fluxes do not balance locally, they continue to balance overall. If there are no points within the plasma boundary where both electrons and ions flow at the same time, the flow within the plasma can be referred to as total non-ambipolar flow. By insuring total non-ambipolar flow, all of the electrons in the plasma remain available for extraction from the ion beam generating device.

FIG. 5 shows in greater detail a first exemplary embodiment of the electron extraction end of the electron beam generating device 100 shown in FIGS. 1-4. FIG. 6 shows in greater detail the supply end of the electron beam generating device 100 shown in FIGS. 1-4. As shown in FIG. 5, an electron sheath 136 is formed within the conductive ion-collection surface 130 that is adjacent to the grounded electron extraction ring 150. It should be appreciated that the plasma potential should be between the extraction ring potential and the ion collection surface potential for an electron sheath to exist. In contrast, an ion sheath 134 is formed adjacent to the interior surface of the conductive ion-collection surface 130. Thus, for a cylindrical conductive ion-collection surface 130, the ion sheath 134 will be an annulus closely following the interior surface of the conductive ion-collection surface 130.

Figure 7:
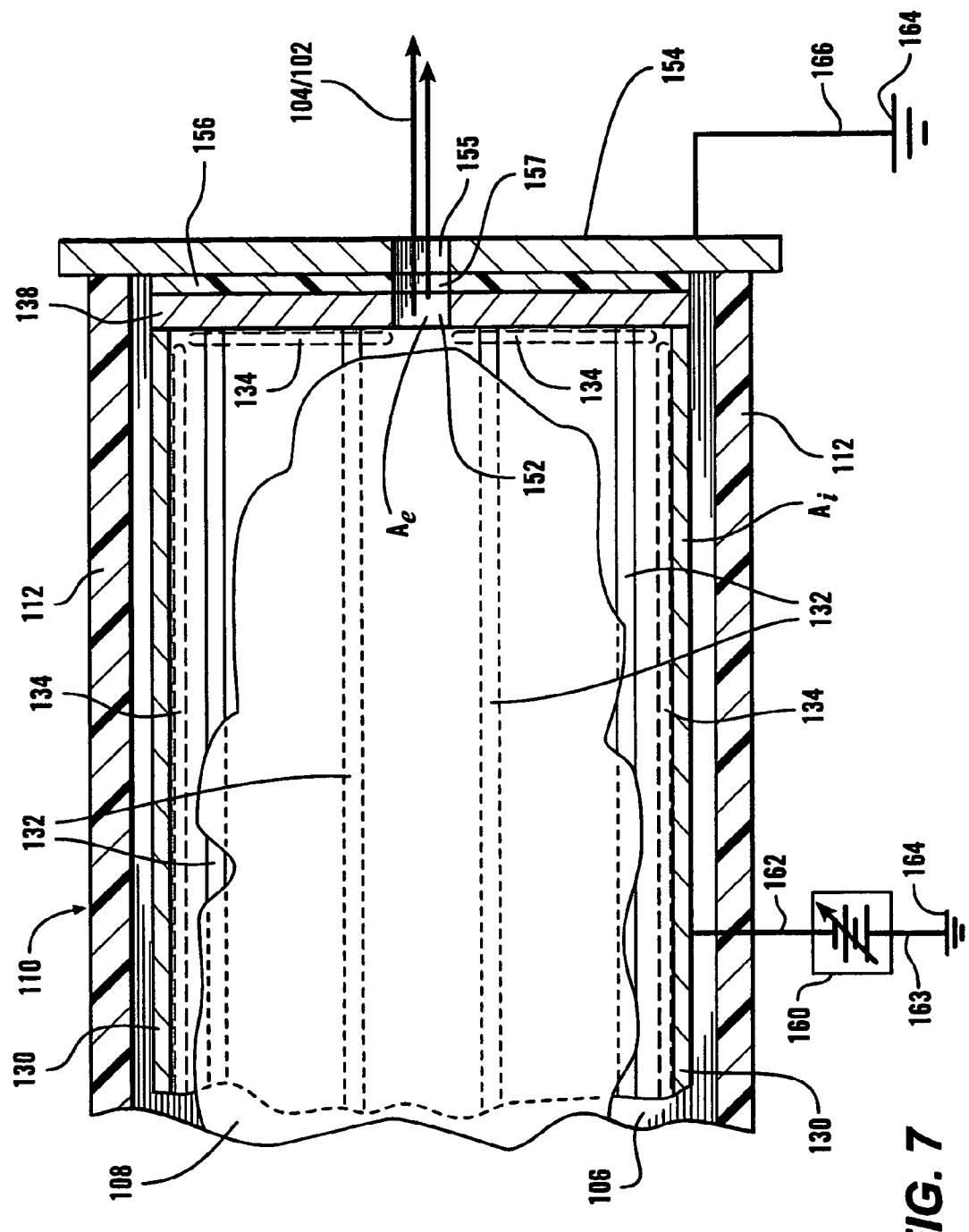
FIG. 7 is a side cross-sectional view showing in greater detail a second exemplary embodiment of the extraction end of the first exemplary embodiment of the electron-beam generating device shown in FIG. 1.

FIG. 7 shows in greater detail a second exemplary embodiment of the electron extraction end of the electron beam generating device 100 shown in FIGS. 1-4. As shown in FIG. 7, in this second exemplary embodiment of the electron extraction end, the insulating end cap 118 of the non-conductive exterior chamber 100 is replaced with a conductive end cap 154 having an exit aperture 155. Additionally, the conductive ion-collection surface 130 is provided with a conductive end cap 138. Furthermore, an insulating member or plate 156, having an aperture 157, is provided between the end caps 138 and 154. In the exemplary embodiment shown in FIG. 7, the insulating member or plate 156 and the end caps 138 and 154 are positioned such that the end caps 138 and 154 are immediately adjacent to, or even touching, the insulating member or plate 156. This conductive end cap 138 contacts the conductive ion-collection surface 130, so that both the conductive end cap 138 and the conductive ion-collection surface 130 are at the same potential. In various exemplary embodiments, the conductive end cap 138 can be a separate element. In various other exemplary embodiments, the conductive end cap 138 is an integral portion of the conductive ion-collection surface 130.

As shown in FIG. 7, the electron extraction aperture 152, which was provided in the electron extraction ring 150 in the first exemplary embodiment of the extraction end of the electron beam generating device 100, is now provided in the conductive end cap 138. Furthermore, the conductive end cap 154 is, in effect, the electron extraction ring. However, it should be appreciated that, in this exemplary embodiment, the electron extraction aperture 152 is located in the conductive end cap 138, as the electron sheath forms in and/or adjacent to the aperture in the conductive end cap 138, rather than the aperture 156 in the conducive end cap 154. Additionally, as shown in FIG. 7, in various exemplary embodiments, the apertures 152, 155 and 157 are generally equal in size and location.

It should be appreciated that, in various other exemplary embodiments, one or more appropriately-sized gaps can be provided between the outer surface of the conductive end cap 138 and the inner surface of the insulating member or plate 156 and/or the inner surface of the conductive end cap 154 and the outer surface of the insulating member or plate 157. In still other exemplary embodiments, the insulating member or plate 156 can be removed completely, with an appropriately-sized gap provided between the end caps 138 and 154. This gap allows the two conductive end caps 138 and 154 to be at different potentials.

It should be appreciated that each of the exemplary embodiments discussed above with respect to FIG. 7 allows the extracted electron beam 104 to be accelerated away from the electron beam generating device 100. Thus, it should be appreciated that, in this second exemplary embodiment, the conductive end cap 154 replaces the extraction ring 150. However, the acceleration of electrons and the extraction of electrons is still provided by the electron sheath that is located in and/or adjacent to the electron extraction aperture 152. Furthermore, the electron extraction aperture 152 and the apertures 155 and 157 in the conductive end cap 154 and the insulating member or plate 156, respectively, are aligned to allow the extracted electron beam 104 and the neutral gas 102 to exit both the plasma chamber 131 and the electron beam generating device 100.

To maintain steady-state operation, the amount of electron loss from the source plasma 108 must be balanced by an equal amount of ion loss from the source plasma 108. Because electrons and ions are born at an equal rate within the plasma 108 created by the time-varying radio-frequency signal applied to the radio-frequency antenna 140, it is desirable to provide an efficient loss mechanism for the positively-charged ions, so that an equal amount of electron current can be extracted from the plasma 108. It should be appreciated that ion and electron losses, gas utilization rates, plasma density and plasma potential effects all affect the total amount of electron current that can be extracted from the electron beam generating device 100. It should be appreciated that, in general, the electron sheath 136 can extract almost all of the random electron current from the plasma 108 that is incident upon the electron sheath 136. In particular, the random electron flux $J_{0e}$, directed towards the electron sheath 136 in a weakly magnetized plasma, at the edge of the electron sheath 136 is:

$$J_{0e} = \frac{n_{0e} e \alpha_e}{4} \sqrt{\frac{8T_e}{\pi m_e}}, \quad (1)$$

where:

$n_{0e}$ is the electron density in the plasma;

e is the electron charge; equal to $1.60217646 \times 10^{-19}$ Coulombs;

$\alpha_e$ is an electron factor that takes into account the drop in electron density associated with potential dips preceding the electron sheath;

$T_e$ is the temperature of the plasma electrons, measured in electron volts (eV); and $m_e$ is the electron mass.

At the same time, the ion flux $J_{0i}$ at the ion sheath edge is:

$$J_{0i} = n_{0i} e \alpha_i \sqrt{\frac{T_e}{m_i}}, \quad (2)$$

where:

$n_{0i}$ is the ion density and should be equivalent to the electron density $n_{0e}$ for singly-ionized ions;

$\alpha_i$ is an ion factor that takes into account the drop in ion density in the presheath near the conductive ion-collection surface.

$T_e$ is the temperature of the plasma electrons measured in electron volts; and $m_i$ is the ion mass.

For total non-ambipolar flow, the ratio of the electron loss area to the ion loss area is found by setting $I_e = I_i$, where $I_e = J_{0e} A_e$ and $I_i = J_{0i} A_i$, and the electron flux $J_{0e}$ to the ion flux $J_{0i}$ associated with electrons created by ionization can be obtained by combining Eq. (1) and Eq. (2) and is approximately equal to:

$$\frac{A_e}{A_i} \approx \frac{\alpha_i}{\alpha_e} \sqrt{\frac{2\pi m_e}{m_i}} \cdot \approx \sqrt{\frac{m_e}{m_i}} \quad (3)$$

A limit to the existence of an electron sheath is provided by the condition that the ion loss area $A_i$ be balanced by the electron loss area $A_e$ it should be appreciated that, when the ion loss area is too small, the electron beam device 100 will still work, but this reduced ion loss area $A_i$ reduces the amount of electron current that can be produced by forming a plasma potential dip preceding the electron sheath, as discussed below. Assuming all of the electrons are lost at the electron sheath 136, then:

$$\frac{A_e}{A_i} \approx \sqrt{\frac{m_e}{m_i}}. \quad (4)$$

assuming the electrons are radially confined. It should be appreciated that an electron sheath will form without a potential dip if:

$$A_e \leq A_i \sqrt{\frac{m_e}{m_i}}. \quad (5)$$

However, an electron sheath will form with a potential dip in front of it if:

$$A_e > A_i \sqrt{\frac{m_e}{m_i}}. \quad (6)$$

It should be appreciated that, for large electron loss areas $A_e$, the electron sheath 136 is no longer a viable solution. For such sufficiently large electron loss areas $A_e$, only a plasma potential more positive than the grounded electrode potential, combined with an ion sheath 134, can provide the necessary balance of electron and ion losses.

It should be appreciated that the net electron loss in traditional devices, such as hollow cathodes, equals the sum of the electrons born by ionization within the plasma, and electrons injected into the plasma by thermionic emission at cathodes, secondary electron emission and the like. However, electron loss within the electron beam generating device 100 only comes from electrons that are born by ionization and perhaps secondary emission. It should also be appreciated that if the electron loss area, $A_e$, is too large, as defined in Eq. (6), then the electron sheath will have a potential dip that reduces the extracted electron current to balance that of the extracted ion current in the device 100. As outlined above, such potential dips occur when the electron extraction area $A_e$ is too large, i.e., the relationship defined in Eq. (6).

In one exemplary electron beam generating device built according to the above-outlined discussion of various exemplary embodiments of electron beam generating devices according to this invention, a cylindrical pyrex chamber has a diameter of 7.5 centimeters and a length of 60 centimeters and was placed within ferrite permanent magnets. A hollow graphite cylinder 7.5 centimeters in diameter and 19 centimeters long was placed within the pyrex chamber and biased at a value between −5V to about −200V compared to the potential on the extraction ring. An electrically grounded 1.25 centimeter diameter graphite ring was placed inside an insulating boron nitride disc and mounted in one end of the cylindrical pyrex chamber. The hollow graphite cylinder was placed adjacent to the electron extraction ring. A single-turn, 0.25-inch-diameter, water-cooled copper pipe was placed, as the radio-frequency antenna, around the pyrex chamber toward the extraction end of the pyrex chamber. In this exemplary embodiment, the grounded electron extraction ring experienced a magnetic field of 72 Gauss.

In this exemplary operating electron beam generating device, ions are lost to the 7.5 centimeter diameter graphite cylinder, which has an ion loss area of 425 cm². In contrast, the electron loss area $A_e$ is restricted to the central aperture, hole or passageway in the 1.25 centimeter-diameter graphite extraction ring, which has an area of 1.23 cm². The 1.23 cm² electron loss area $A_e$ implies that an ion loss area of at least about 350 cm² for argon (Ar) and at least about 640 cm² for xenon (Xe) (assuming the electron and ion factors have values of $\alpha_e$~1, and $\alpha_i$~0.5) would be needed. When the plasma in this exemplary operating electron beam generating device is operated with an argon feed gas and a plasma density of $5 \times 10^{12}$/cm³, a 15 A electron current can be extracted through the central aperture, hole or passageway having an electron loss area of 1.23 cm². The 15 A current was extracted with the following parameters: 1000 W RF power at a frequency of 13.56 MHz, −50V bias on the ion collection cylinder, 0V bias (grounded) on the extraction ring, an electron loss area of 1.23 cm², and an Ar neutral gas flow rate of 15 sccm with an aluminum ion-collection cylinder. 10 A electron extraction current was obtained with a graphite ion-collection cylinder with somewhat different dimensions.

A positively-charged ion born within an electron beam generating device according to this invention is transported from the bulk plasma through a presheath and then to the ion sheath, where it contacts the conductive ion-collection surface and picks up an electron, converting the positively-charged ion into a neutral atom. The neutral atom is then free to travel back into the bulk plasma within the plasma chamber portion to be re-ionized. At any one time, only a small fraction, on the order of about 1 atom out of 1000, of the neutral gas is ionized. However, as described above, each neutral atom may be recycled many times, such as, for example, up to 20 times or more, before that neutral atom finally exits the electron beam generating device according to this invention.

Typically, the neutral atoms will exit through the aperture in the electron extraction ring. However, in contrast to the neutral atoms, the positively-charged ions see a potential barrier at the aperture in the electron extraction ring of the electron beam generating device so that only neutrals and electrons can leave the interior chamber. Reusing the neutral gas atoms in this way is possible because the positively-charged ions, in contrast to ion thrusters, are not being extracted through the exit aperture. That is, when extracting ions, as in an ion thruster, the ion outflow rate can never exceed the neutral inflow rate. However, because the electron beam generating device according to this invention is an electron source that extracts electrons, the electron outflow rate can be many times the neutral gas inflow rate. In general, the ratio of extracted electrons to the amount of neutral gas exiting the electron beam generating device depends on the plasma density, the electron temperature, the flow rate of neutral gas into the interior chamber, and the size of the electron extraction aperture.

It should be appreciated that, if higher plasma densities are obtained, a higher electron current can be extracted from the electron beam generating device or a correspondingly smaller electron loss area $A_e$ can be used. Of course, it should be appreciated that, by using a smaller electron loss area $A_e$, a correspondingly smaller ion loss area $A_i$ for the conductive ion-collection surface can be used. It should be appreciated that the electron extraction current cannot exceed the ion extraction current that is controlled by the ion loss area $A_i$. It should be appreciated that using a smaller electron loss area $A_e$ has the advantage of lower neutral gas losses.

For electron beam generating devices that are used as charge neutralizers in satellite and/or spacecraft applications, it is beneficial to produce the plasma 108 using a method that creates the largest fraction of ionization possible, so that the neutral feed gas 102 is not wasted. For example, if the plasma source were 100% efficient in ionizing a neutral gas 102, as it flows through the interior space 106, and each neutral atom is used only once before it touches the ion collection cylinder, a feed gas flow rate of 1 sccm (standard cubic centimeter per minute) of argon allows obtaining (is equivalent to) 0.072 A of extraction current.

However, the inventors have experimentally determined that, when the feed gas 102 is neutral argon, the neutral argon feed gas 102 is more efficiently utilized to create extraction current at flow rates between about 2.5 sccm and about 15 sccm. At these flow rates, the amount of extraction current that can be obtained corresponds to using every atom approximately 14 times as it passes from the gas supply tube 116, through the plasma 108 and out through the central aperture, hole or passageway 152 into a target region. In conventional plasma-based electron sources, plasma ions and electrons are both extracted. As indicated above, in various electron beam generating devices according to this invention, any ions that encounter the electron sheath are reflected. Furthermore, all ions encounter the ion-collection walls and are re-circulated as neutrals. As set forth in Eqs. (1) and (2), the amount of extractable current is linear with the plasma density, which, in turn, increases with radio-frequency power applied to the radio-frequency antenna 140.

Figure 17:
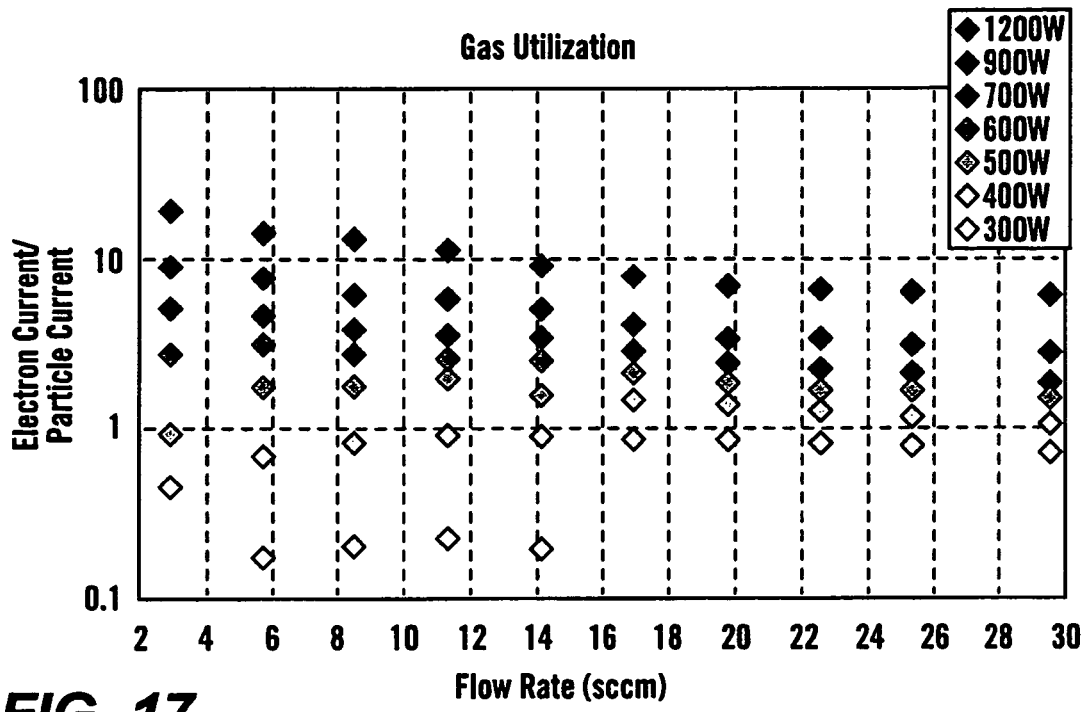
FIG. 17 is a graph of the electron/particle current ratio as a function of radio-frequency power and gas flow rate.

FIG. 17 is a graph showing the results of an experiment using the above-outlined exemplary embodiment of an electron beam generating device according to this invention. As shown in FIG. 17, when the radio-frequency power is at or above about 400 W, for most neutral gas supply flow rates into the electron beam generating device, at least about 1 electron is extracted for each neutral atom lost from the electron beam generating device through the aperture in the electron extraction ring. Additionally, as the radio-frequency power increases, for any flow rate, the electron current-particle current ratio increases. As indicated above, at an RF power of 1000 W and flow rates between about 3 sccm and about 15 sccm, ratios of about 10 to about 20 were obtained.

Figure 8:
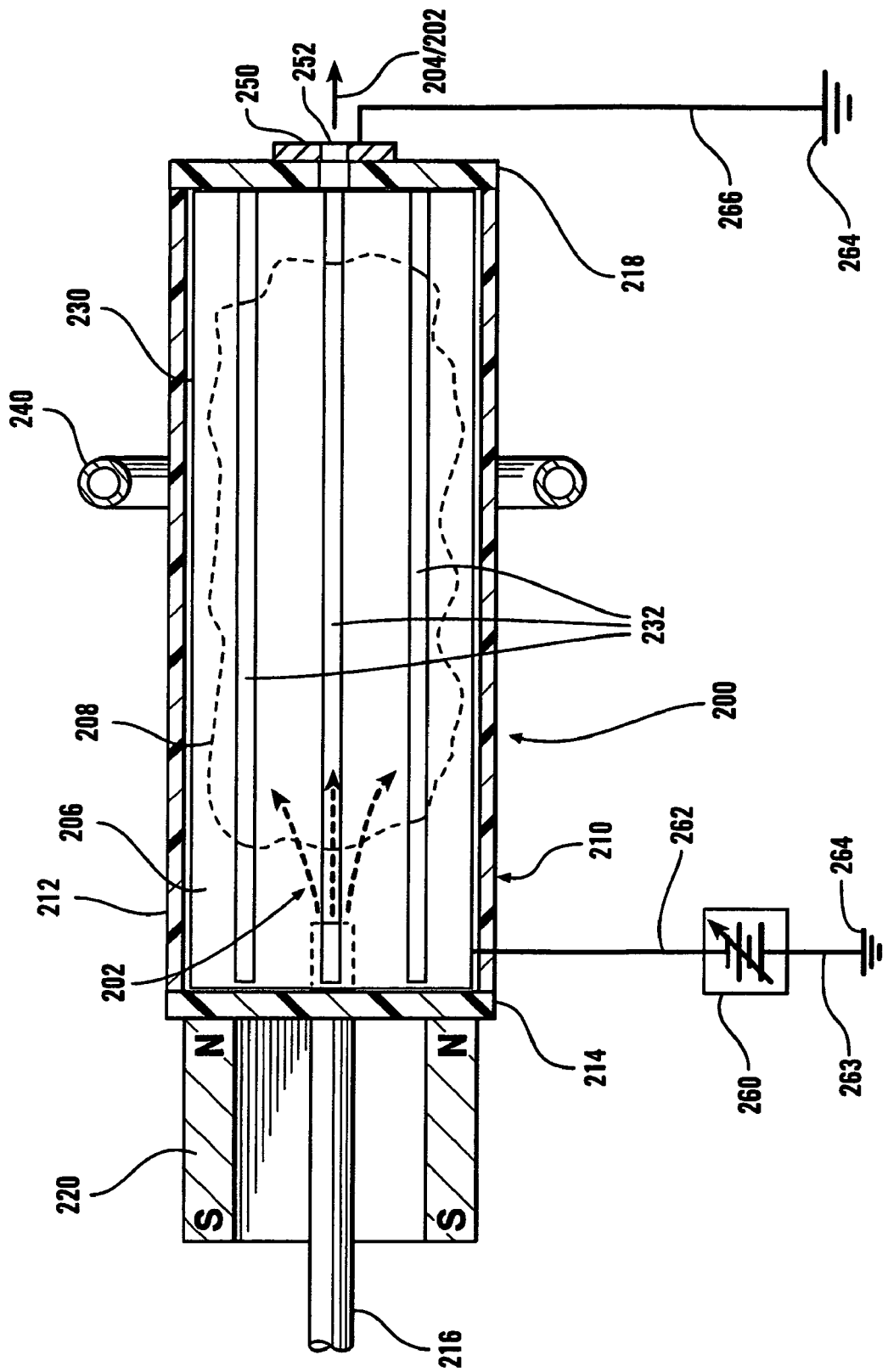
FIG. 8 is side-cross sectional view of a second exemplary embodiment of an electron beam generating device according to this invention.

FIG. 8 shows a second exemplary embodiment of an electron beam generating device 200 according to this invention. As shown in FIG. 8, in this second exemplary embodiment, the electron beam generating device 200 includes a non-conductive exterior chamber 210, at least one steady-state magnet 220, a conductive ion-collection surface 230, a radio-frequency antenna 240, an electron extraction ring 250, and a negative voltage source 260. However, in contrast to the first exemplary embodiment of an electron beam generating device 100 shown in FIGS. 1-7, in the second exemplary embodiment of the electron beam generating device 200 shown in FIG. 8, the at least one steady-state magnet 220 is placed at the rear of the device, rather than around the non-conductive exterior chamber 210.

As shown in FIG. 8, the non-conductive exterior chamber 210 includes a non-conductive chamber surface 212, supply and extraction end walls 214 and 218, respectively and the gas supply tube 216. As in the first exemplary embodiment, the gas supply tube 216 passes through the interior of the at least one steady-state magnet 220 and extends through the supply end wall 214, while the electron extraction ring 250 is attached to the extraction end wall 218. The gas supply tube 216 supplies a feed gas 202 to an interior space 206 within the non-conductive exterior chamber 210. The feed gas 202 is converted into a plasma 208 within the conductive ion-collection surface 230. Electrons extracted from the plasma 208 are ejected from the electron beam generating device 200 through the central aperture, hole or passageway 252 in the electron extraction ring 250.

A radio-frequency signal is applied to the radio-frequency antenna 240. The electromagnetic field generated in response to placing this RF signal on the radio-frequency antenna 240 is inductively coupled to inductive or helicon modes through the slots or voids 232 formed in the conductive ion-collection surface 230 to the plasma 208 within the conductive ion-collection surface 230. The negative voltage source 260 is connected by a conductor 262 to the conductive ion-collection surface 230. The electron extraction ring 250 is connected by a conductor 266 to a local reference ground potential 264.

Figure 9:
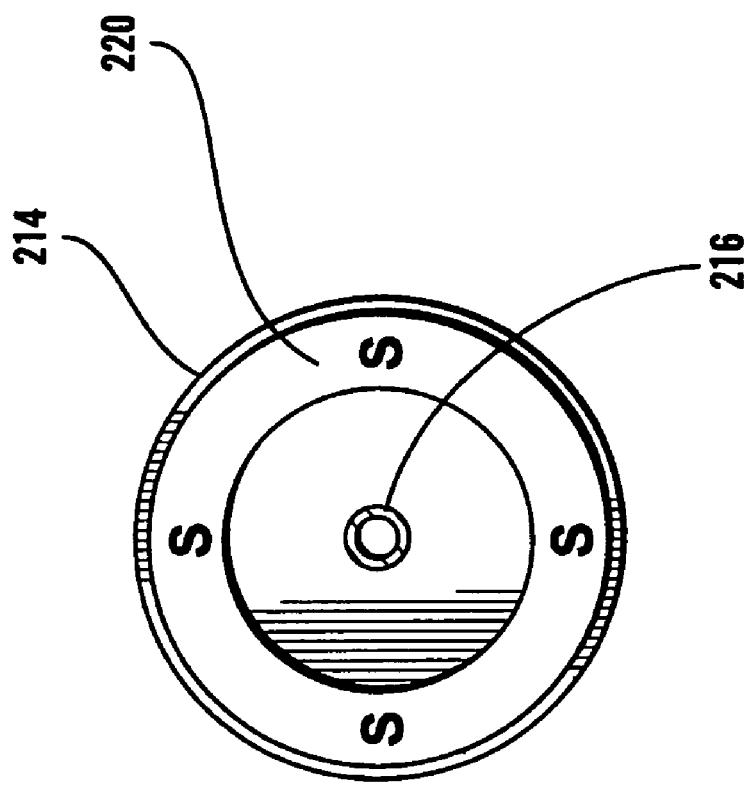
FIG. 9 is an end plan view of one end of the second exemplary embodiment of the electron beam generating device shown in FIG. 8.

FIG. 9 shows a plan exterior view of the supply end wall 214, the at least one steady-state magnet 220 and the gas supply tube 216 of the electron beam generating device 200. As shown in FIG. 9, the at least one steady-state magnet 220 is a single, annularly-shaped permanent magnet. However, it should be appreciated that an electromagnet could be used as the steady-state magnet 220. Additionally, two or more separate magnet segments could be used to implement the annular steady-state magnet 220.

As shown in FIGS. 8 and 9, in various exemplary embodiments, the annular steady-state magnet 220 is relatively thin, with a central void that is substantially larger than the gas supply tube 216. In such exemplary embodiments, the gas supply tube 216 can be placed along the axis of the magnet 220 and the non-conductive exterior chamber 210. However, the gas supply tube 216 could be placed anywhere within the interior of the magnet 220. In various other exemplary embodiments, the annular steady-state magnet 220 is thick, with a central passageway that is only slightly larger than the gas supply tube 216. In such exemplary embodiments, the gas supply tube 216 is typically placed along the axis of the magnet 220 and the non-conductive exterior chamber 210.

Figure 10:
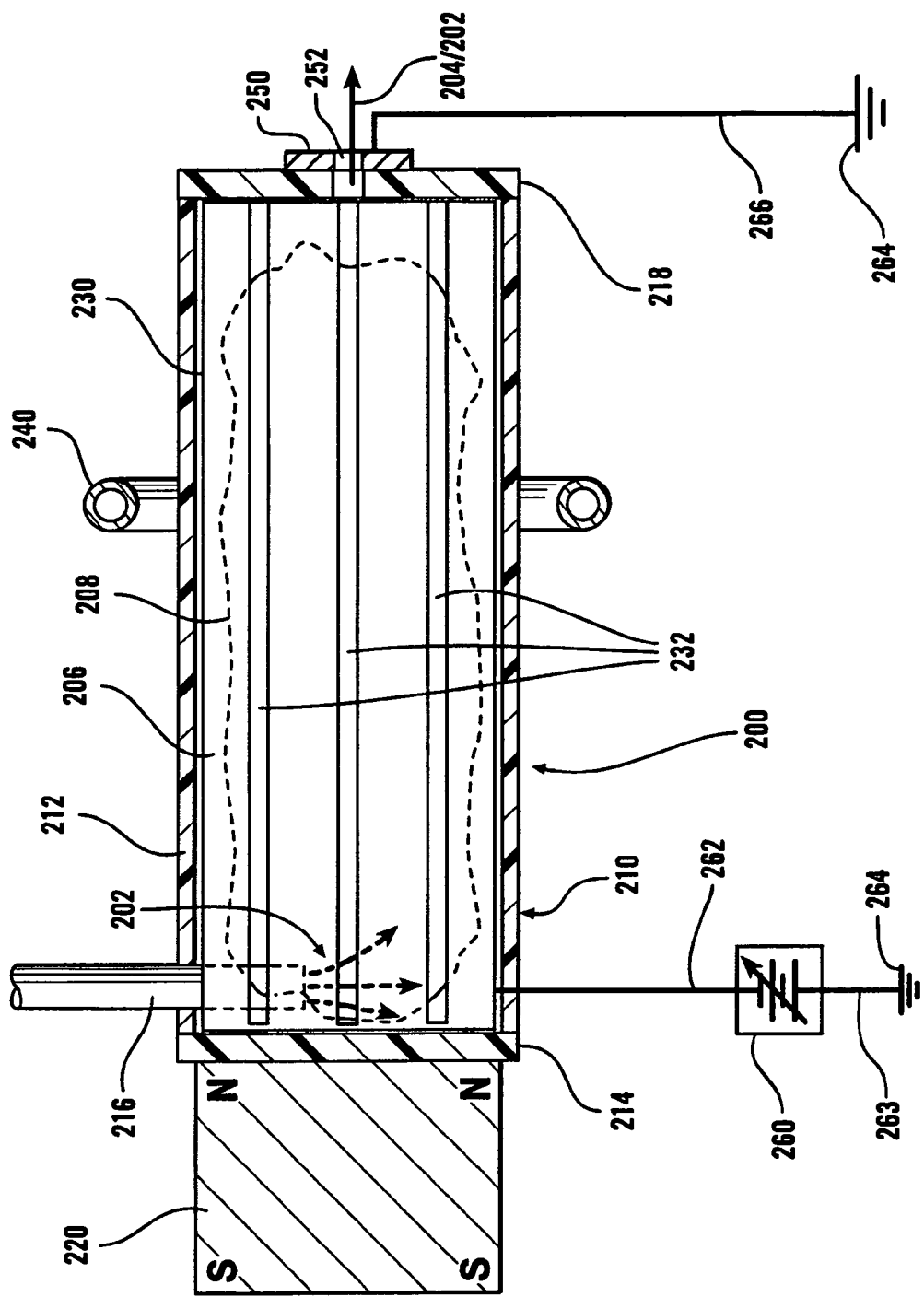
FIG. 10 is a side cross-sectional view of a third exemplary embodiment of an electron-beam generating device according to this invention.

FIG. 10 shows a variation of the second exemplary embodiment of the electron beam generating device 200 according to this invention, where the steady-state magnet 220 is a solid cylinder or other solid shape and the gas supply tube 216 extends through the sidewall 212 of the non-conductive exterior chamber 210 rather than the end wall 214. In this exemplary embodiment, the gas supply tube 216 also extends through the side wall, rather than the end wall, of the conductive ion-collection surface 230. It should be appreciated that the gas supply tube 216 can be located anywhere along the axial length of the non-conductive exterior chamber 210.

One advantage provided by the magnetic field generated by the one or more steady state magnets 120 or 220 is that it increases the plasma density. The magnetic field also reduces the relative electron losses to the extraction ring, while allowing the electron sheath to form at or near the extraction aperture. This makes the electron beam extraction device more efficient and increases the maximum current that can be produced by the electron beam extraction device.

Figure 18:
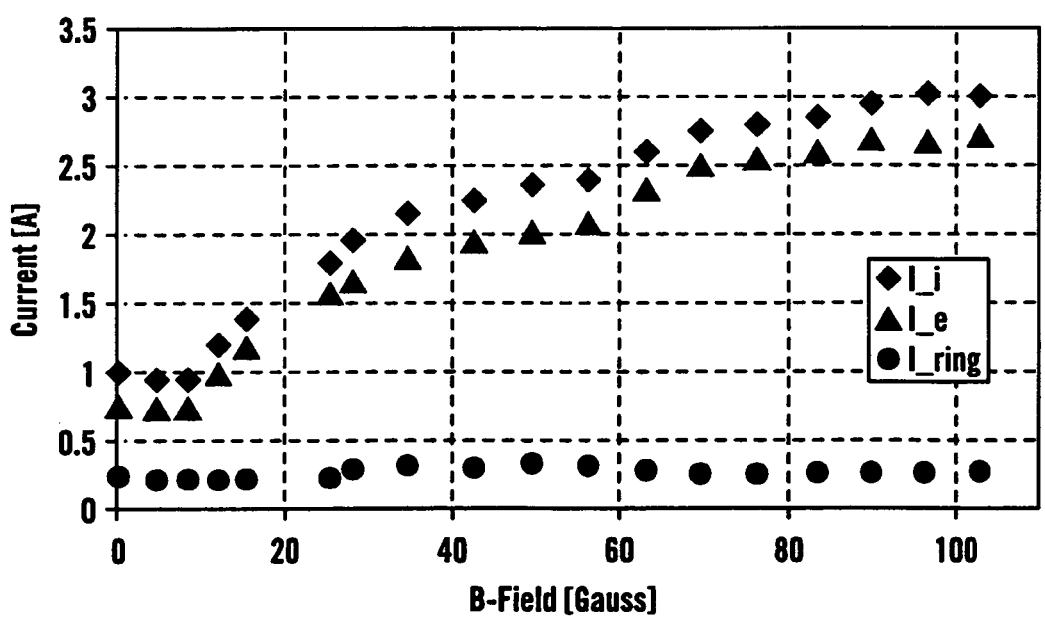
FIG. 18 is a graph of the generated currents as a function of magnetic field strength.
Figure 19:
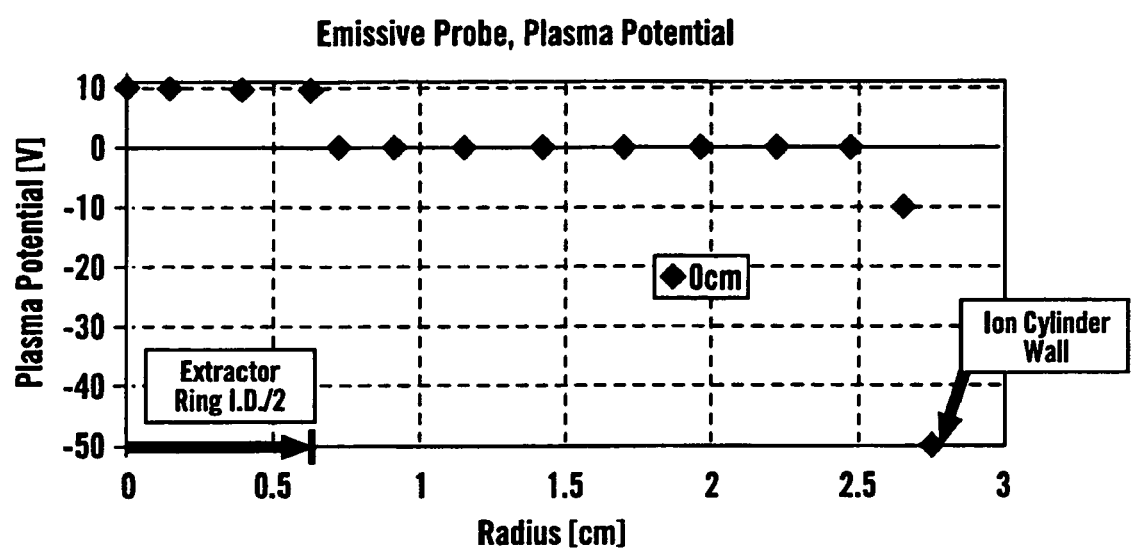
FIG. 19 is a graph of the plasma potential as a function of radial distance from the axis of the ion collection surface.

FIG. 18 is a graph showing the results of an experiment using the exemplary embodiment of an electron beam generating device 100 according to this invention. The graph shown in FIG. 18 demonstrates the importance of the presence of the magnetic field at the exit aperture of the electron beam extraction device. As shown in FIG. 18, as the magnetic field strength increases, the extraction current $I_e$ increases. This occurs because the plasma density increases as the magnetic field strength increases. At the same time, as shown in FIG. 18, the current $I_{ring}$ that is lost to the electron extraction ring stays substantially constant even as the magnetic field strength increases. As a consequence, the fraction of the extraction current that is lost to the electron extraction ring $I_{ring}$ decreases significantly with increasing magnetic field strength.

Figure 11:
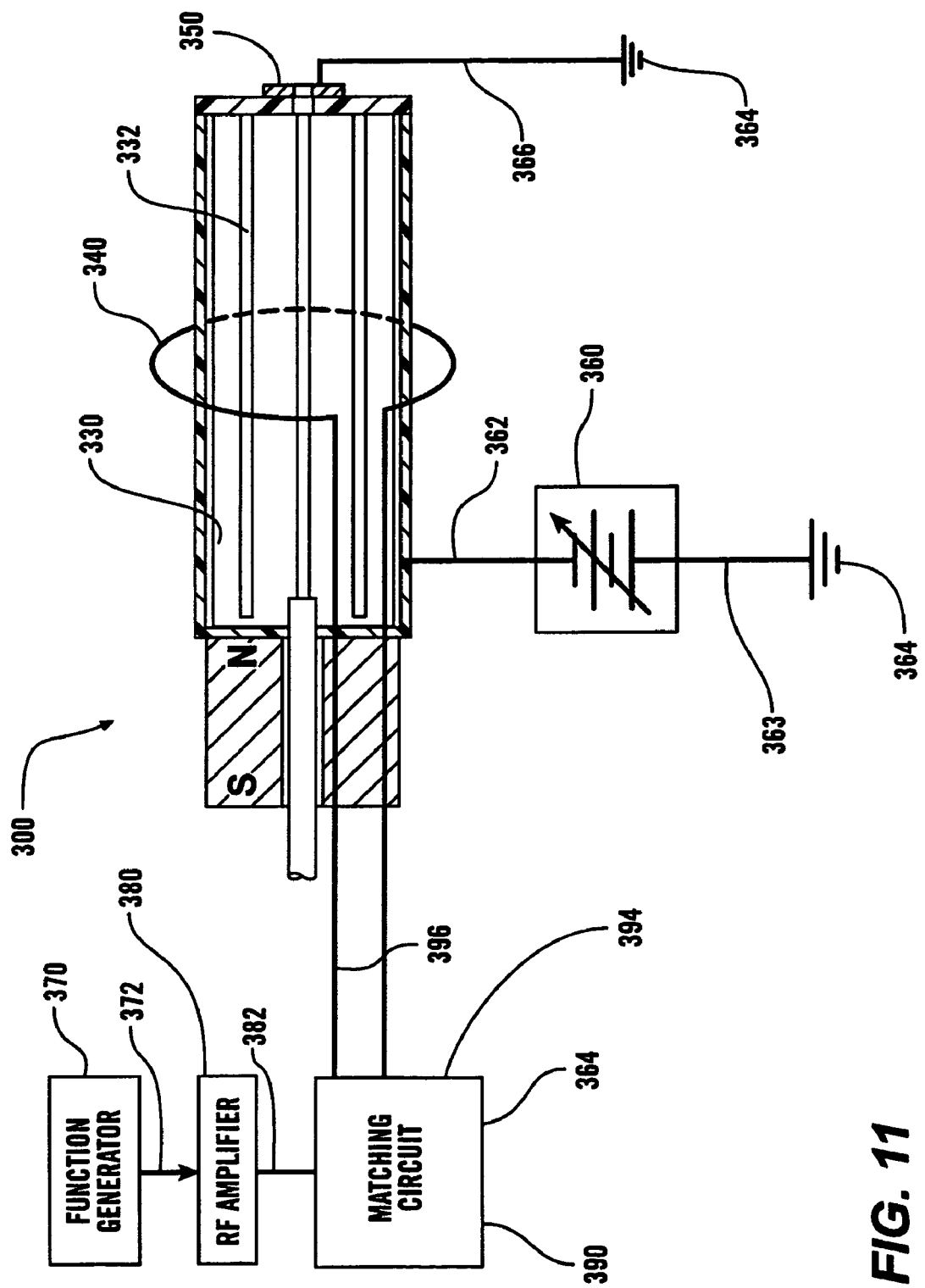
FIG. 11 is a schematic view of one exemplary embodiment of an electron beam generating device and antenna drive circuit according to this invention.
Figure 13:
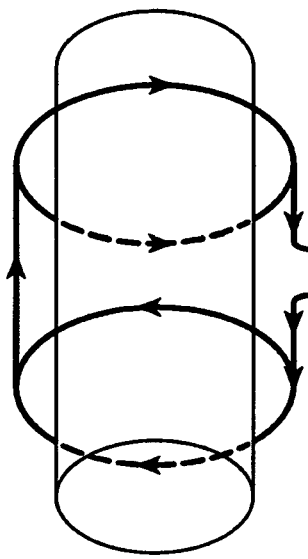
FIGS. 12-15 show a plurality of different antenna designs useable to create a plasma within the first and second exemplary electron beam generating devices shown in FIGS. 1, 8 and 10.
Figure 15:
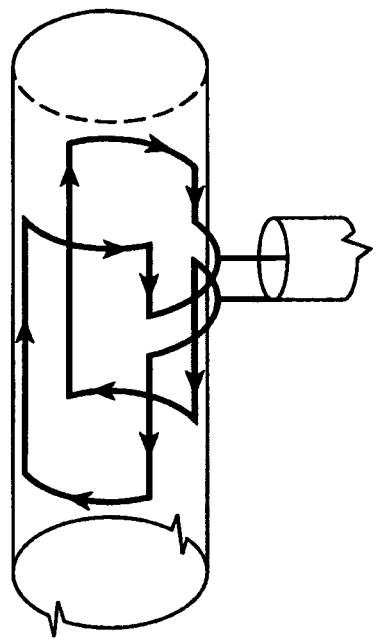
Figure 12:
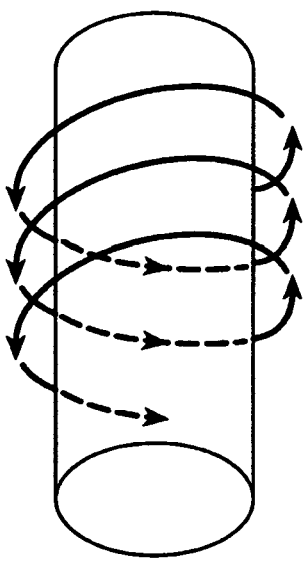
Figure 14:
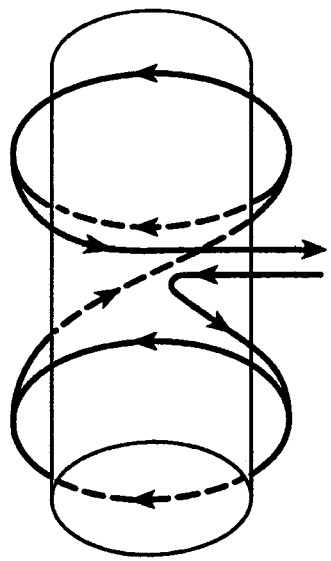

FIG. 11 is a schematic view of one exemplary embodiment of an electron beam generating device 300 and associated antenna drive circuitry according to this invention. As shown in FIG. 11, a negative voltage source 360 is connected by a conductor 362 to a conductive ion-collection surface 330 that is contained within the electron beam generating device 300. The negative voltage source 360 is also connected by a conductor 363 to a reference ground potential 364. An electron extraction ring 350 is connected by a conductor 366 to the ground potential 364 as well. A radio-frequency antenna 340 is placed adjacent to, and around, the conductive ion-collection surface 330. Ends of the radio-frequency antenna 340 are connected by signal lines 396 to a matching circuit 390. A function generator 370 generates and outputs a time-varying radio-frequency electric signal on a signal line 372 to a radio-frequency amplifier 380. The radio-frequency amplifier 380 amplifies the radio-frequency time-varying electric signal output by the function generator 370. The radio-frequency amplifier 380 outputs the amplified radio-frequency signal on a signal line 382 to the matching circuit 390.

FIGS. 12-15 illustrate a variety of additional radio-frequency antenna designs that can be used in place of the radio-frequency antennas 140, 240 and 340 shown in FIGS. 1, 8 and 11. It should be appreciated that different ones of these radio-frequency antennas are appropriate for different plasma densities and/or different operational modes, such as the inductive coupled mode and the helicon mode.

Figure 16:
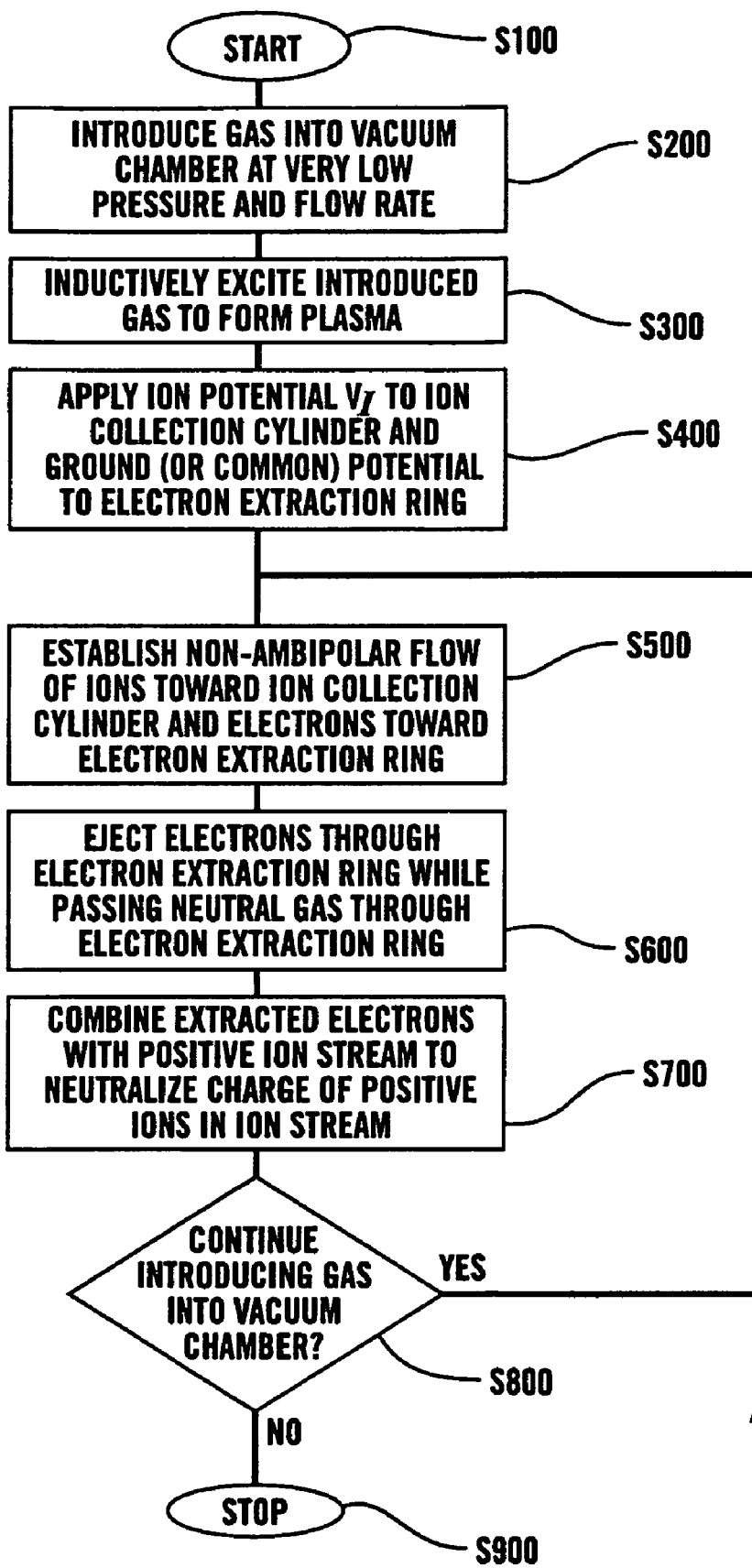
FIG. 16 is a flowchart outlining one exemplary embodiment of a method for generating and extracting an electron beam according to this invention.

FIG. 16 illustrates one exemplary embodiment of a method for generating an electron beam and using the generated electron beam to neutralize a positively-charged ion stream according to this invention. It should be appreciated that this is only one exemplary use of an electron beam generating device according to this invention, which could be used for any other appropriate known or later-developed use, as outlined above. In particular, FIG. 16 illustrates the actions that occur to a given quantity of gas. It should be appreciated that, as gas is continually introduced into the device, all of steps S100-S700 occur simultaneously relative to different quantities of gas or electrons. As shown in FIG. 16, beginning in step S100, operation of the method continues to step S200, where gas is introduced into a vacuum chamber at very low pressures and at a defined flow rate. Then, in step S300, the introduced gas is inductively ionized to form a plasma. Then, in step S400, an ion potential $V_I$ is applied to an ion collection cylinder, while a reference ground potential is applied to an electron extraction ring of the electron beam generating device. Operation then continues to step S500.

In step S500, a non-ambipolar flow of ions towards the ion collection cylinder and electrons towards the electron extraction ring is created. In various exemplary embodiments, this non-ambipolar flow is a total non-ambipolar flow. Next, in step S600, electrons are ejected through the electron extraction ring while neutral gas passes through the electron extraction ring. Then, in step S700, the extracted electrons are combined with a positively-charged ion stream to neutralize the positively-charged ions in the ion stream. Operation then continues to step S800.

In step S800, a determination is made whether to continue introducing the supply gas into the vacuum chamber. If so, operation jumps back to step S500 and steps 500-700 are repeated. In contrast, if additional gas is not to be introduced into the vacuum chamber, operation continues to step S900, where operation of the method ends.

In various exemplary embodiments, the amount of electron current can be extracted from an electron beam extraction device according to this invention varies linearly with the plasma density. In turn, the plasma density increases as the radio-frequency power increases. In experiments performed by the inventors, the extracted current increase linearly with increases in the radio-frequency power and did not indicate a saturation point at high radio-frequency powers, indicating room for future progress. At radio-frequency powers between 60 W and 90 W, the plasma did not visually fill the entire conductive ion-collection surface, thus decreasing the effective ion loss area $A_i$, resulting in decreased ion collection current.

As the DC bias on the conductive ion-collection surface was decreased from 0V to −60V, the conductive ion-collection surface repelled a larger number of electrons away from the conductive ion-collection surface. This increased the local plasma density, which then allowed the conductive ion-collection surface to collect more ion current. The measured electron current from an electron beam extraction device according to this invention agreed closely with the total amount of ion extraction current. This shows that, in some exemplary embodiments, all of the electrons that are lost within the electron beam extraction device according to this invention are lost through the electron extraction ring.

One complication to understanding the electron extraction from the plasma source is the plasma potential difference between the plasma side and the extraction side. Regardless of the bias on the conductive ion-collection surface within the electron beam extraction device according to this invention, the plasma potential of the target side remained more positive than the potential of the plasma source region. At the same time, the plasma potential within the plasma source region remained more positive than the potential on the conductive ion-collection surface.

In experiments, the respective plasma source and conductive ion-collection surface potentials were −10V and −50V. It should be appreciated that, in these experiments, the extraction ring was grounded. Accordingly, this allowed ion loss through an ion sheath to the conductive ion-collection surface within the source region. Similarly, the plasma potential in the region around the extraction aperture remained more positive than the plasma potential in the region. This indicated the existence of an electron sheath at the boundary between the plasma region and the electron extraction ring and aperture that is extracting electrons from the plasma.

As discussed above, the conductive ion-collection surface acts as a Faraday shield. By using the conductive ion-collection surface as a Faraday shield, the plasma potential did not fluctuate significantly. In contrast, when the ion-collection surface/Faraday shield was modified in the exemplary embodiment shown in FIG. 1, so that it was no longer underneath the radio-frequency antenna, a large AC fluctuating plasma potential was created. Without the conductive ion-collection surface/Faraday shield, there was significant capacitive coupling between the radio-frequency antenna and the plasma. As a result, the plasma potential oscillated back and forth, with a peak-to-peak oscillation of over 100V. Canceling the fluctuating plasma potential by using the conductive ion-collection surface/Faraday shield, is, in various exemplary embodiments, beneficial, as it allows for larger and more stable extraction currents to be obtained.

The conductive ion-collection surface provided the necessary ion loss area $A_i$, while the smaller grounded electron extraction ring was used to extract the electrons through an electron sheath into a target region. It is possible, using an electron beam extraction device according to this invention, to scale the extracted electron current based on the total amount of the ion loss area $A_i$ of the conductive ion-collection surface that is located within the source plasma. The total amount of extracted electron current from an electron beam extraction device according to this invention is ultimately limited by one or more of the ion loss area $A_i$, the electron loss area $A_e$, the neutral gas flow rate, and the radio-frequency power.

While this invention has been described in conjunction with the exemplary embodiments outlined above, various alternatives, modifications, variations, improvements and/or substantial equivalents, whether known or that are or may be presently foreseen, may become apparent to those having at least ordinary skill in the art. Accordingly, the exemplary embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The invention claimed is:

1. An electron beam generating device, comprising:
   a first chamber usable to contain a feed gas and a plasma formed using the feed gas, the first chamber having a first end wall having an opening through which the feed gas is able to exit the first chamber;
   a gas supply tube usable to supply the feed gas into the first chamber, the gas supply tube extending at least into the first chamber;
   a conductive surface provided within the first chamber, the conductive surface electrically connected to an at least relatively negative potential source that is usable to place an at least relatively negative potential onto the conductive surface;
   at least one radio-frequency antenna placed around the first chamber and usable to ionize the feed gas within the first chamber to form a plasma; and
   an electron extraction ring provided adjacent to the first end wall of the first chamber and relative to the opening in the first end wall, the electron extraction ring electrically connected to a reference ground potential source and having an electron extraction aperture, wherein:
   the potential placed on the conductive surface is negative relative to the plasma and the electron extraction ring;
   at least an electron sheath forms within the first chamber relative to the electron extraction ring, the electron sheath permitting electrons and neutral particles to pass out of the plasma toward the electron extraction ring and preventing positively-charged ions from moving towards the electron extraction ring; and
   the electron extraction ring extracts and outputs at least a beam of electrons from the electron beam generating device.

2. The electron beam generating device of claim 1, further comprising at least one magnet located adjacent to the first chamber, the at least one magnet arranged such that a generally solenoidal magnetic field extends along an axial direction of the first chamber.

3. The electron beam generating device of claim 2, wherein the at least one magnet is at least one permanent magnet.

4. The electron beam generating device of claim 2, wherein the at least one magnet is at least one electromagnet.

5. The electron beam generating device of claim 4, wherein the at least one electromagnet generates a substantially time-constant magnetic field.

6. The electron beam generating device of claim 2, wherein the at least one magnet is a cylindrical-prism-shaped or polygonal-prism-shaped magnet having a central passage extending along the axial direction of the magnet, the first chamber extending through the central passage such that the at least one magnet extends around the first chamber.

7. The electron beam generating device of claim 2, wherein the at least one magnet is a cylindrical-prism-shaped or polygonal-prism-shaped magnet, the at least one magnet positioned adjacent to a second end wall of the first chamber.

8. The electron beam generating device of claim 7, wherein the at least one magnet is a cylindrical-prism-shaped or polygonal-prism-shaped magnet having at least one passage extending along the axial direction of the magnet, the gas supply tube extends through at least one of the at least one passage in the magnet and at least the second end wall of the first chamber.

9. The electron beam generating device of claim 2, wherein the solenoidal magnetic field generated by the at least one magnet increases a plasma density of the plasma formed within the first chamber.

10. The electron beam generating device of claim 2, wherein the solenoidal magnetic field generated by the at least one magnet improves a uniformity of the electron beam output by the electron beam generating device.

11. The electron beam generating device of claim 2, wherein the solenoidal magnetic field generated by the at least one magnet decreases a fraction of electron current that is drawn to the electron extraction ring.

12. The electron beam generating device of claim 2, wherein:
   a time-varying electric signal is applied to the at least one radio-frequency antenna to generate time-varying electric and magnetic fields around the at least one radio-frequency antenna; and
   a strength of the solenoidal magnetic field generated by the at least one magnet and a power of the time-varying magnetic field generated by the at least one radio-frequency antenna are sufficient to excite helicon waves within the plasma formed in the first chamber.

13. The electron beam generating device of claim 2, wherein the solenoidal magnetic field extends axially through the electron extraction aperture and is substantially uniform across the electron extraction aperture.

14. The electron beam generating device of claim 1, wherein a plurality of electrons are output from the electron beam generating device for each feed gas particle output from the electron beam generating device.

15. The electron beam generating device of claim 1, wherein a uniform plasma potential forms across the area of the electron extraction aperture.

16. An electron beam generating device, comprising:
   a first chamber usable to contain a feed gas and a plasma formed using the feed gas, the first chamber having a first end wall having an opening through which the feed gas is able to exit the first chamber;
   a conductive chamber provided within the first chamber, the conductive chamber having at least a circumferential wall than extends circumferentially within the first chamber, a first end wall and an electron extraction end wall, an aperture formed in the electron extraction end wall that allows electrons and neutral particles to exit the conductive chamber, the conductive chamber electrically connected to an at least relatively negative potential source that is usable to place an at least relatively negative potential onto the conductive chamber;
   a gas supply tube usable to supply the feed gas into the conductive chamber, the gas supply tube extending into the first chamber and the conductive chamber;
   at least one radio-frequency antenna placed around the first chamber and usable to ionize the feed gas within the conductive chamber into the plasma; and a conductive end wall of the first chamber provided adjacent to the extraction end wall of the conductive chamber, the conductive end wall having a second aperture located relative to the aperture in the extraction end wall, wherein:

at least an electron sheath forms within the first chamber relative to the aperture provided in the extraction end wall, the electron sheath permitting electrons and neutral particles to pass out of the plasma toward the aperture provided in the extraction end wall and preventing positively-charged ions from moving towards the aperture provided in the extraction end wall; and the extraction end wall extracts and outputs at least a beam of electrons from the electron beam generating device.

17. A method for generating a beam of electrons, comprising:

supplying an amount of feed gas to into a plasma region of a first chamber, the first chamber enclosing the plasma region, a conductive surface provided within the first chamber around the plasma region and an electron extraction ring provided at one end of the first chamber, a generally constant solenoidal magnetic field provided to the first chamber, a first potential applied to the electron extraction ring, a relatively-negative second potential applied to the conductive surface;

applying a time-varying radio-frequency signal to at least one antenna provided around the first chamber;

generating time varying radio-frequency electric and magnetic fields based on the time-varying radio-frequency signal applied to the at least one antenna;

ionizing at least some of the supplied amount of feed gas to form a plasma within the plasma region, the plasma containing free electrons and free positively-charged ions;

attracting at least some of the free electrons to the electron extraction ring through an electron sheath;

attracting at least some of the free positively-charged ions to the conductive surface through an ion sheath;

converting the attracted positively-charged ions back into neutral feed gas particles, the neutral feed gas particles returning to the plasma region, where they are available to be re-ionized into the plasma.

* * * * *